US010784031B2

(12) United States Patent
Sasaki et al.

(10) Patent No.: US 10,784,031 B2
(45) Date of Patent: Sep. 22, 2020

(54) FILTER COMPONENT AND BOBBIN

(71) Applicant: SUMIDA CORPORATION, Chuo-Ku, Tokyo (JP)

(72) Inventors: Naoki Sasaki, Natori (JP); Jiayu Chen, Guangzhou (CN)

(73) Assignee: SUMIDA CORPORATION (JP)

( * ) Notice: Subject to any disclaimer, the term of this patent is extended or adjusted under 35 U.S.C. 154(b) by 0 days.

(21) Appl. No.: 16/675,393

(22) Filed: Nov. 6, 2019

(65) Prior Publication Data

US 2020/0075206 A1 Mar. 5, 2020

Related U.S. Application Data

(63) Continuation of application No. 15/861,099, filed on Jan. 3, 2018, now Pat. No. 10,504,642.

(30) Foreign Application Priority Data

Feb. 23, 2017 (JP) ................................. 2017-032621

(51) Int. Cl.
| | | |
|---|---|---|
| *H01F 5/06* | (2006.01) | |
| *H01F 5/02* | (2006.01) | |
| *H03H 1/00* | (2006.01) | |
| *H01F 27/30* | (2006.01) | |
| *H01F 27/02* | (2006.01) | |
| *H03H 7/42* | (2006.01) | |

(Continued)

(52) U.S. Cl.
CPC ................. *H01F 5/06* (2013.01); *H01F 5/02* (2013.01); *H01F 27/02* (2013.01); *H01F 27/306* (2013.01); *H01F 27/325* (2013.01); *H01F 37/00* (2013.01); *H01F 41/098* (2016.01); *H03H 1/0007* (2013.01); *H03H 7/427* (2013.01); *H03H 2001/005* (2013.01)

(58) Field of Classification Search
CPC ........ H03H 7/427; H03H 1/0007; H01F 5/06; H01F 5/02
USPC .................................................. 333/181, 185
See application file for complete search history.

(56) References Cited

U.S. PATENT DOCUMENTS 5,793,273 A 8/1998 Yamaguchi et al.

FOREIGN PATENT DOCUMENTS

| JP | H06-268465 A | 9/1994 |
| JP | 2001-143946 A | 5/2001 |
| JP | 2007-207788 A | 8/2007 |

OTHER PUBLICATIONS

Extended European Search Report for EP Application No. 18158026.7, dated Jul. 19, 2018 (9 pages).

*Primary Examiner* — Rakesh B Patel
(74) *Attorney, Agent, or Firm* — Harness, Dickey & Pierce, P.L.C.

(57) ABSTRACT

A filter component assembly kit includes a bobbin that is configured with first and second members and a core that is in a quadrangular frame shape. When the first member is assembled with the second member, a through hole is formed in the bobbin. The through hole extends in a first direction. The core is configured with first and second extension bars. The first and second extension bars extend in parallel in the first direction. When the first extension bar is disposed in the through hole of the bobbin, rotation of the core around the first extension bar is prevented. First allowance of the first extension bar in a second direction, which is perpendicular to the first direction, in the through hole is larger than second allowance of the first extension bar in a third direction, which is perpendicular to the first and second directions, in the through hole.

12 Claims, 17 Drawing Sheets

(51) Int. Cl.
*H01F 41/098* (2016.01)
*H01F 27/32* (2006.01)
*H01F 37/00* (2006.01)

FILTER COMPONENT AND BOBBIN

CROSS-REFERENCE TO RELATED APPLICATIONS

This application is a continuation of U.S. patent application Ser. No. 15/861,099, filed on Jan. 3, 2018, and claims priority to Japanese Patent Application No. 2017-032621, filed on Feb. 23, 2017. The entire contents of the above applications are incorporated herein by reference.

BACKGROUND

The present invention relates to a filter component assembly kit, a filter component and a method for manufacturing a filter component.

In Japanese Patent Publication No. H06(1994)-268465, a filter component is described. The filter component is configured with a core that is in a quadrangular frame shape and a bobbin that is configured by a divided configuration formed of two parts. The filter component has a gear (gear member) for winding a wire around the bobbin by rotating the bobbin. However, because the filter component in Japanese Patent Publication No. H06(1994)-268465 has the gear for winding the wire around the bobbin, an extra region is needed for accommodating the gear separately from a region in which the wire is wound. Therefore, the filter component is increased in size as compared with the performance of the filter component.

SUMMARY

The present invention attempts to solve the problems explained above. An object of the present invention is to provide a filter component assembly kit, a filter component and a method for manufacturing a filter component, which allows easy winding of a wire around a bobbin without using a gear.

A filter component assembly kit according to one aspect of the present invention includes: a bobbin that is configured by connecting a first member to a second member, wherein when the first member is assembled with the second member, a through hole is formed in a center of the bobbin, the through hole extending in a first direction; and a core that is in a quadrangular frame shape, the core being configured with first, second, third, and fourth extension bars, the first and second extension bars extending in parallel in the first direction, the third and fourth extension bars extending in parallel in a second direction, the second direction being perpendicular to the first direction. When the first extension bar is disposed in the through hole of the bobbin, rotation of the core around the first extension bar is prevented. First allowance (freedom of movement) of the first extension bar in the second direction in the through hole is larger than second allowance (freedom of movement) of the first extension bar in a third direction in the through hole, the third direction being perpendicular to the first and second directions.

A filter component according to another aspect of the present invention includes: a bobbin that is configured by connecting a first member to a second member, wherein when the first member is assembled with the second member, a through hole is formed in a center of the bobbin, the through hole extending in a first direction; a wire wound around the bobbin; and a core that is in a quadrangular frame shape, the core being configured with first, second, third, and fourth extension bars, the first and second extension bars extending in parallel in the first direction, the third and fourth extension bars extending in parallel in a second direction, which is perpendicular to the first direction. The first extension bar is disposed in the through hole of the bobbin so that rotation of the core around the first extension bar is prevented. First allowance (freedom of movement) of the first extension bar in the second direction in the through hole is larger than second allowance (freedom of movement) of the first extension bar in a third direction in the through hole, the third direction is perpendicular to the first and second directions.

With respect to a method for manufacturing a filter component according to another aspect of the present invention, the filter component includes: a bobbin that is configured with a first member to a second member, a through hole being formed in a boundary between the first and second members, the through hole extending in a first direction; a wire wound around the bobbin; and a core that is in a quadrangular frame shape, the core being configured with first, second, third, and fourth extension bars, the first and second extension bars extending in parallel in the first direction, the third and fourth extension bars extending in parallel in a second direction, which is perpendicular to the first direction. First allowance of the first extension bar in the second direction in the through hole is larger than second allowance of the first extension bar in a third direction in the through hole. Third direction is perpendicular to the first and second directions. The method comprises: assembling the core to the bobbin, which is formed by assembling the first and second members, so that the first extension bar is disposed in the through hole; winding a wire around the bobbin by passing the wire in a gap between the bobbin and the second extension bar after the core moves in a first moving direction from the first extension bar toward the second extension bar along the second direction so as to enlarge the gap between the bobbin and the second extension bar; and moving the core in a second moving direction opposite to the first moving direction.

According to the present invention, winding a wire around a bobbin without using a gear can be easily performed. As a result, miniaturization of a filter component can be realized.

DESCRIPTION OF EXEMPLARY EMBODIMENTS

Figure 1:
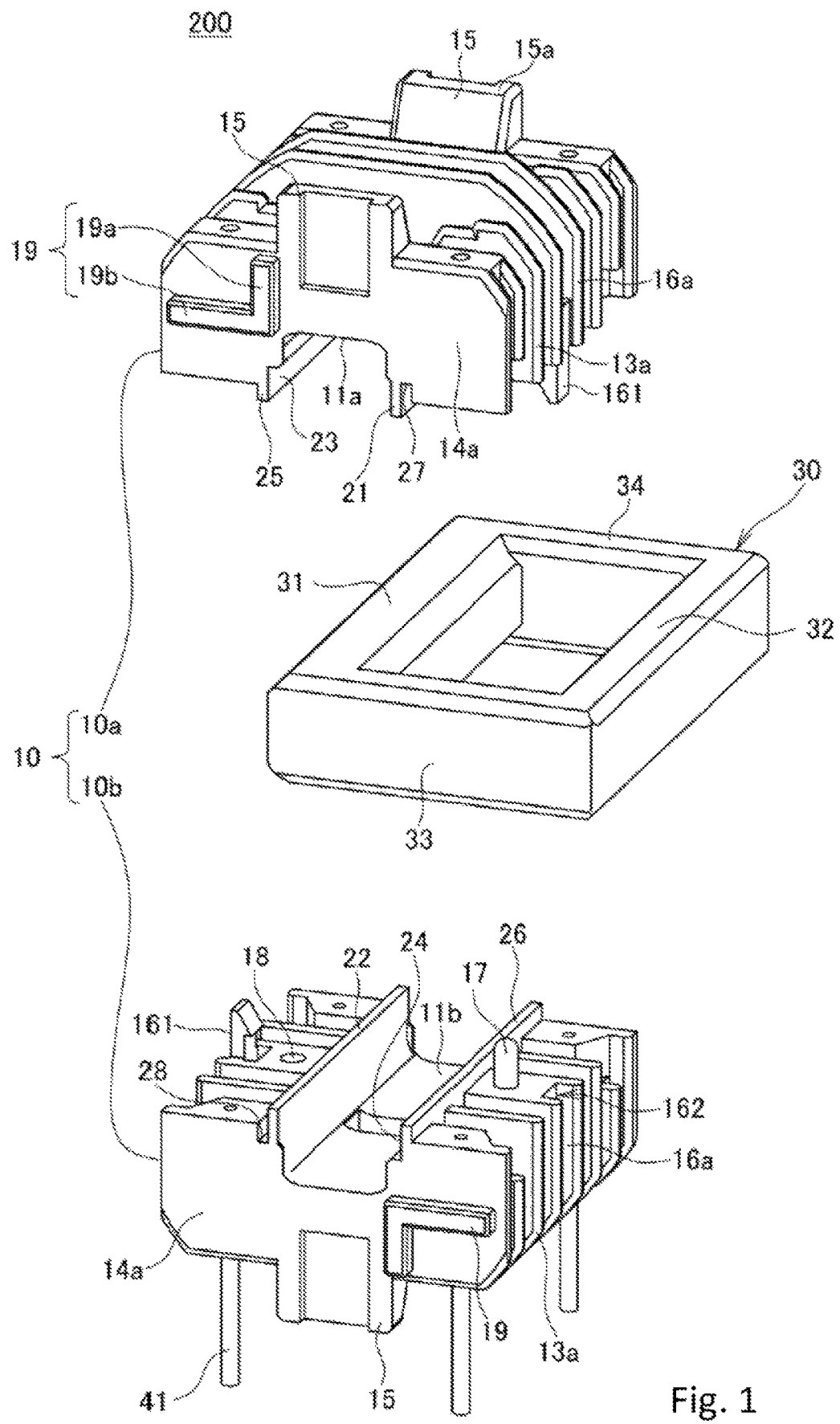
FIG. 1 is an exploded perspective view that shows a first member, a second member, and a core that configure a filter component according to a first embodiment of the present invention.

Embodiments according to the present invention are explained below with reference to the drawings. In regards to the drawings, redundant explanations with respect to the same configurations are omitted but the same reference numerals are used for labeling.

First Embodiment

First, a first embodiment according to the present invention will be explained below with reference to FIGS. 1-9.

Figure 6:
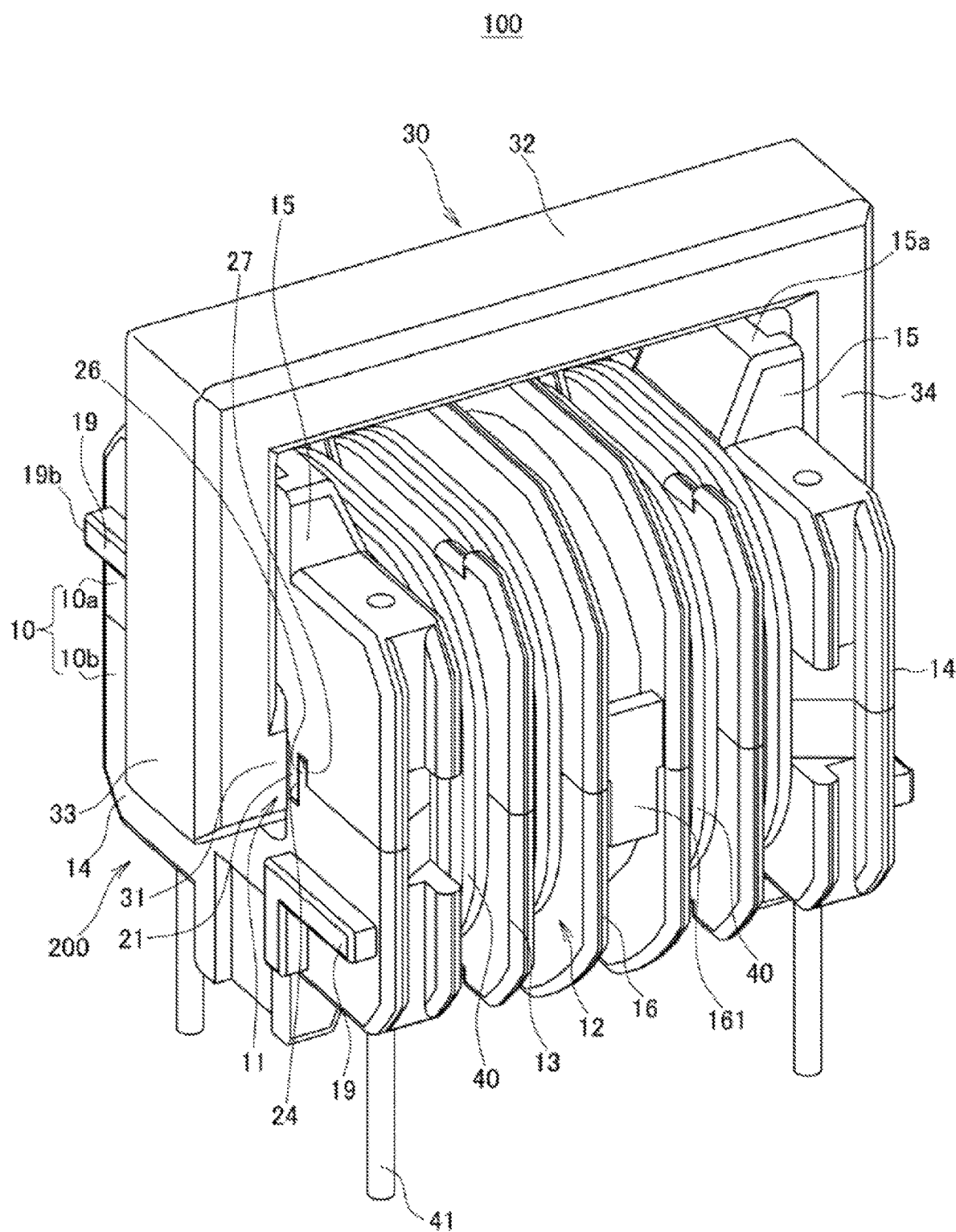
FIG. 6 is a perspective view of a filter component according to the first embodiment of the present invention.

A filter component assembly kit 200 according to the first embodiment is used to assemble a filter component 100 (FIG. 6). The filter component 100 is configured with a bobbin 10, a core 30, and a wire (a wire rod) 40 (FIG. 6). Specifically, the bobbin 10 has (a boundary or a wall of) a through hole 11 (FIG. 6) after assembling a first member 10a and a second member 10b to each other. The core 30 is entirely integrally formed in a quadrangular frame shape as a monolithic body. Further, the wire 40 is wound around the bobbin 10.

As shown in FIG. 1, the filter component assembly kit 200 is configured with the first member 10a, the second member 10b, and the core 30. The core 30 has a first extension part (bar) 31 and a second extension part (bar) 32 that extend in parallel with each other.

The first member 10a, the second member 10b, and the core 30 are assembled to each other. The first extension part 31 is disposed so as to pass through the through hole 11, and at the same time, the second extension part 32 is located at an outside of the through hole 11. In this assembled state (FIGS. 2-4), a rotation of the core 30 relative to the bobbin 10 is prevented around a longitudinal axis of the first extension part 31. At the same time, the first extension part 31 can move in a facing direction of the first extension part 31 and the second extension part 32 in the through hole 11. Further, a first moving length (allowance) in which the first extension part 31 can move in the facing direction in the through hole 11 is larger (longer) than a second moving length (allowance) in which the first extension part 31 can move in an orthogonal direction to both the facing direction and the longitudinal direction of the first extension part 31 in the through hole 11.

In this case, a state in which the rotation of the core 30 relative to the bobbin 10 is prevented around the longitudinal axis of the first extension part 31 means that the core 30 cannot rotate around the bobbin 10 at more than 360 degrees so that a rotatable angle of the core 30 relative to the bobbin 10 is limited (for instance, the angle is limited within 45 degrees). This angle is determined by such as a clearance between an outer surface of the first extension part 31 and an inner surface of a boundary (or an inner wall) of the through hole 11. Further, the second moving length can also be zero (0).

Figure 3:
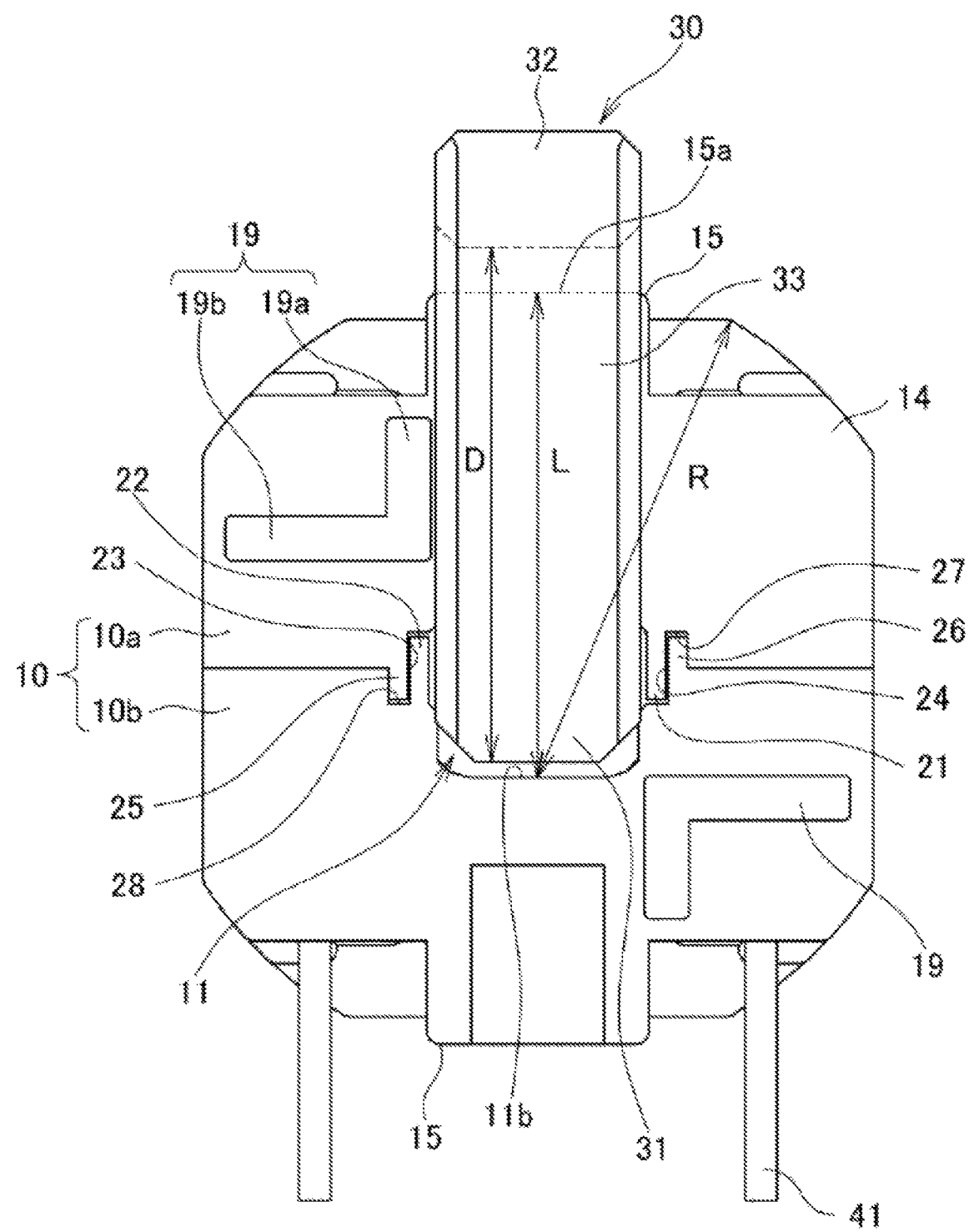
FIG. 3 is a front view that shows a state in which a first member, a second member, and a core that configure a filter component are assembled to each other according to the first embodiment of the present invention.
Figure 4:
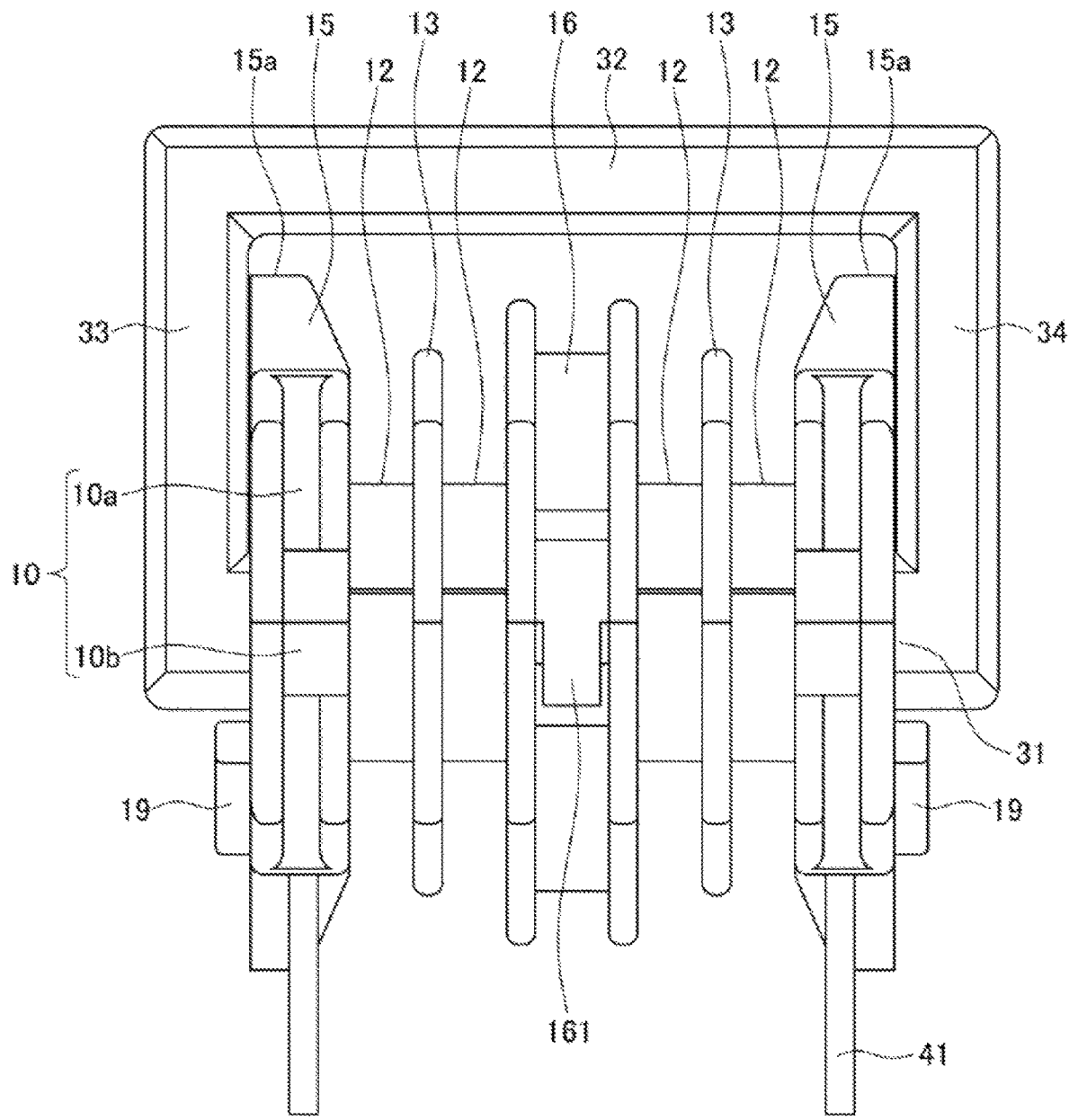
FIG. 4 is a side view that shows a state in which a first member, a second member, and a core that configure a filter component are assembled to each other according to the first embodiment of the present invention.

More detail regarding the embodiment will be explained below. Here, in order to make the explanation simple, the explanation will be provided below by defining directions such as up and down. That is, the right and left directions in FIG. 3 (corresponding to a depth direction in FIG. 4) are defined to be a width direction, and the right and left directions in FIG. 4 (corresponding to a depth direction in FIG. 3) are defined to be a depth direction. Further, the up and down directions in FIGS. 3 and 4 are defined to be a vertical direction. However, these directions do not always correspond to the directions in the manufacture and use of the filter component assembly kit 200 and the filter component 100.

In the present embodiment, an assembling direction of the first member 10a and the second member 10b that configure the bobbin 10 corresponds to a vertical direction. Further, the core 30 is arranged in a position in which a third extension part (bar) 33 and a fourth extension part (bar) 34 explained below extend in a vertical direction. Therefore, the facing direction of the first extension part 31 and the second extension part 32 and the assembling direction (a disassemble direction) of the first member 10a and the second member 10b are the same, i.e., the vertical directions.

Figure 7:
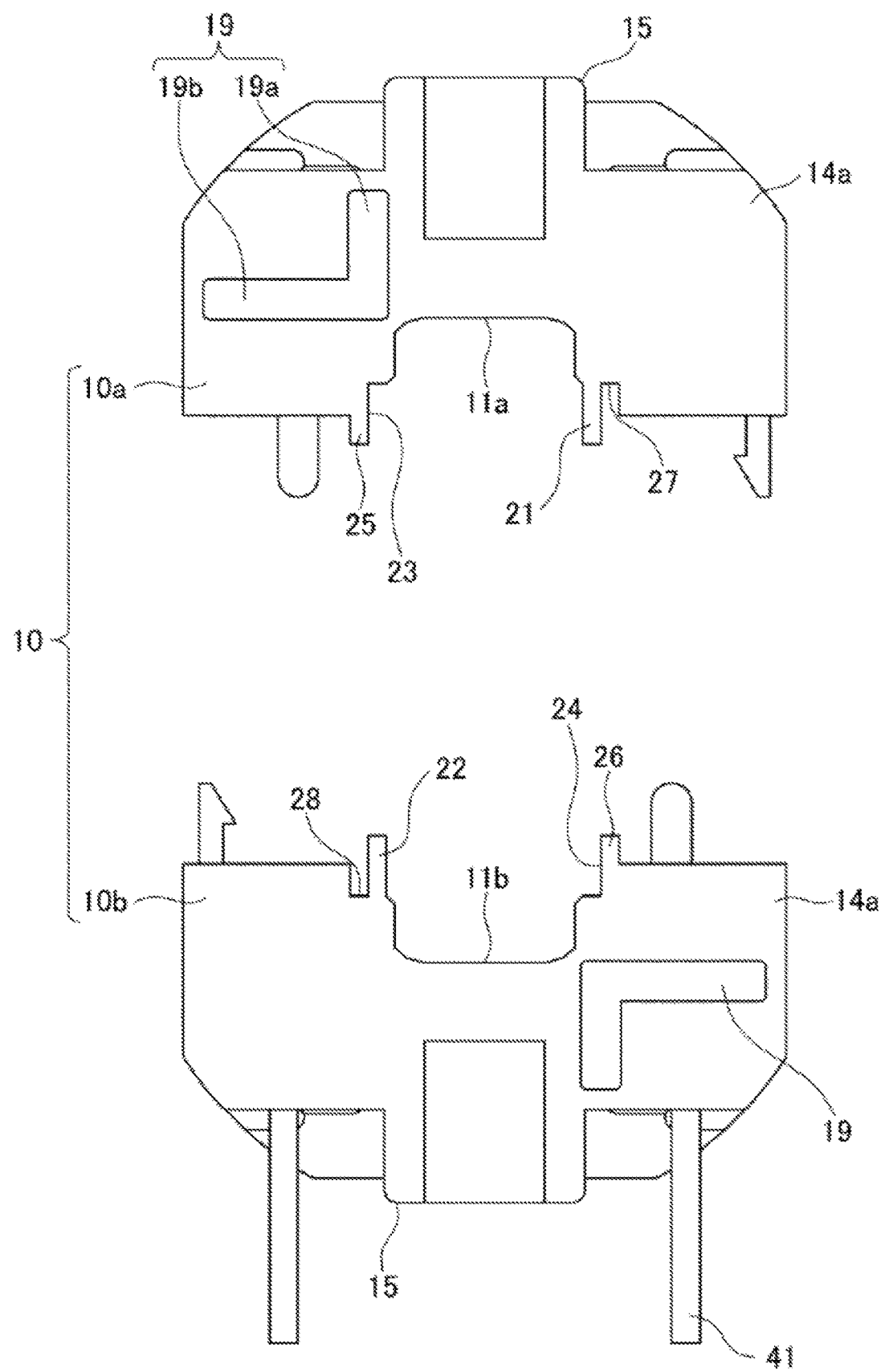
FIG. 7 is an exploded view (a front view) that shows a first member and a second member that configure a bobbin of a filter component according to the first embodiment of the present invention.

As shown in, for instance, FIG. 7, the first member 10a has a first recess 11a that will configure a part of the boundary of the through hole 11. Further, the second member 10b has a second recess 11b that will configure the boundary of the through hole 11 together with the first recess 11a. The first recess 11a is formed in a surface, which is opposed to the second member 10b, of the first member 10a. Further, the second recess 11b is formed in a surface, which is opposed to the first member 10a, of the second member 10b.

Figure 8:
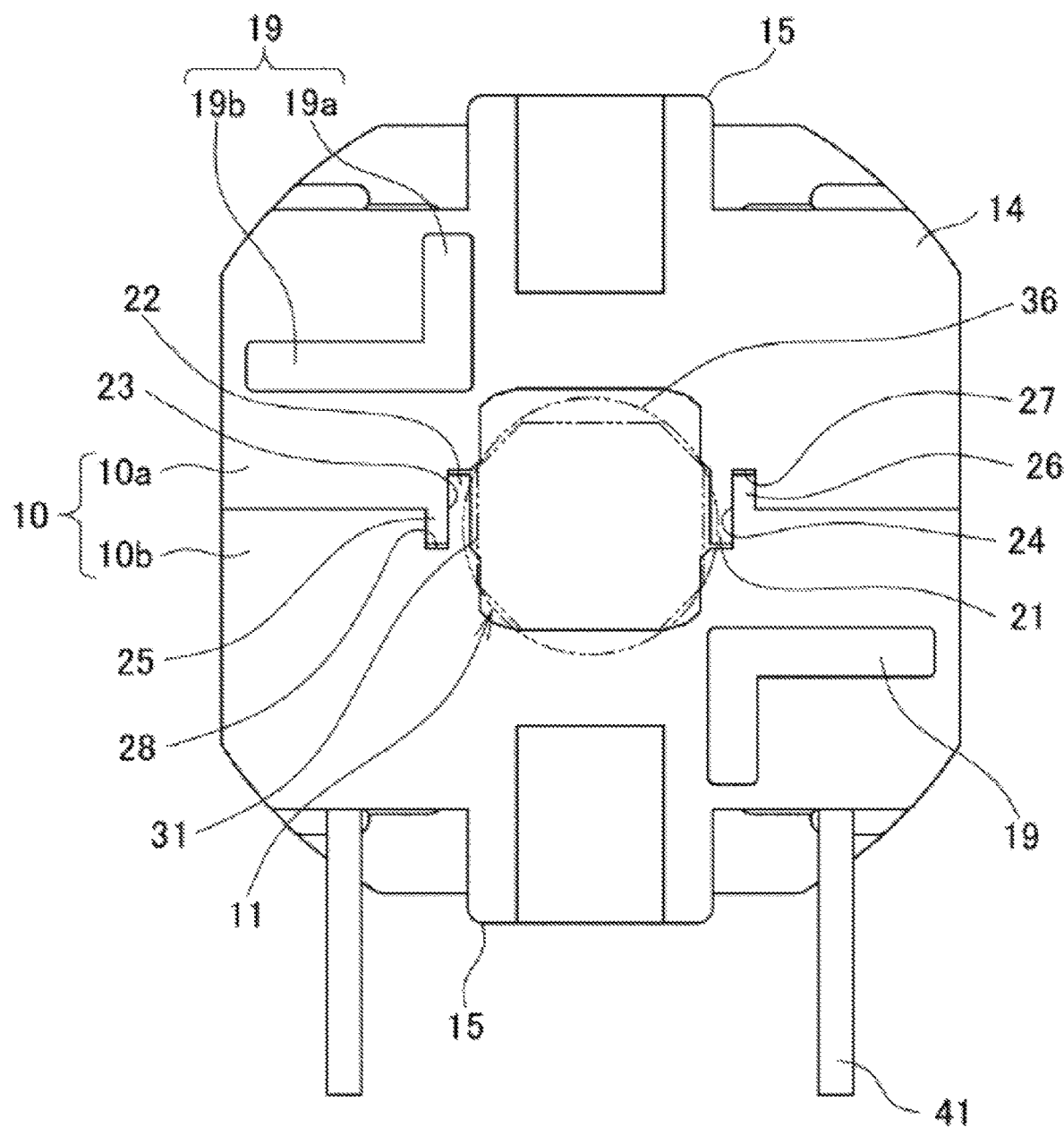
FIG. 8 is a front view of a bobbin of a filter component according to the first embodiment of the present invention.

As shown in FIG. 8, because the first member 10a and the second member 10b are assembled to each other, the bobbin 10 is configured with the first member 10a and the second member 10b. Further, at the same time, the boundary of the through hole 11 is formed by combining the first recess 11a with the second recess 11b. The through hole 11 passes through the bobbin 10 in the depth direction in FIG. 3 (corresponding to the width direction (right and left directions) in FIG. 4). The through hole 11 passes through a central axis of the bobbin 10. A longitudinal direction of the through hole 11 can be referred to as an axis direction of the bobbin 10. Further, the longitudinal direction of the first recess 11a can be referred to as an axis direction of the first member 10a. Also, the longitudinal direction of the second recess 11b can be referred to as an axis direction of the second member 10b.

In the present embodiment, the first member 10a and the second member 10b that configure the bobbin 10 are formed in the same shape as each other.

Figure 2:
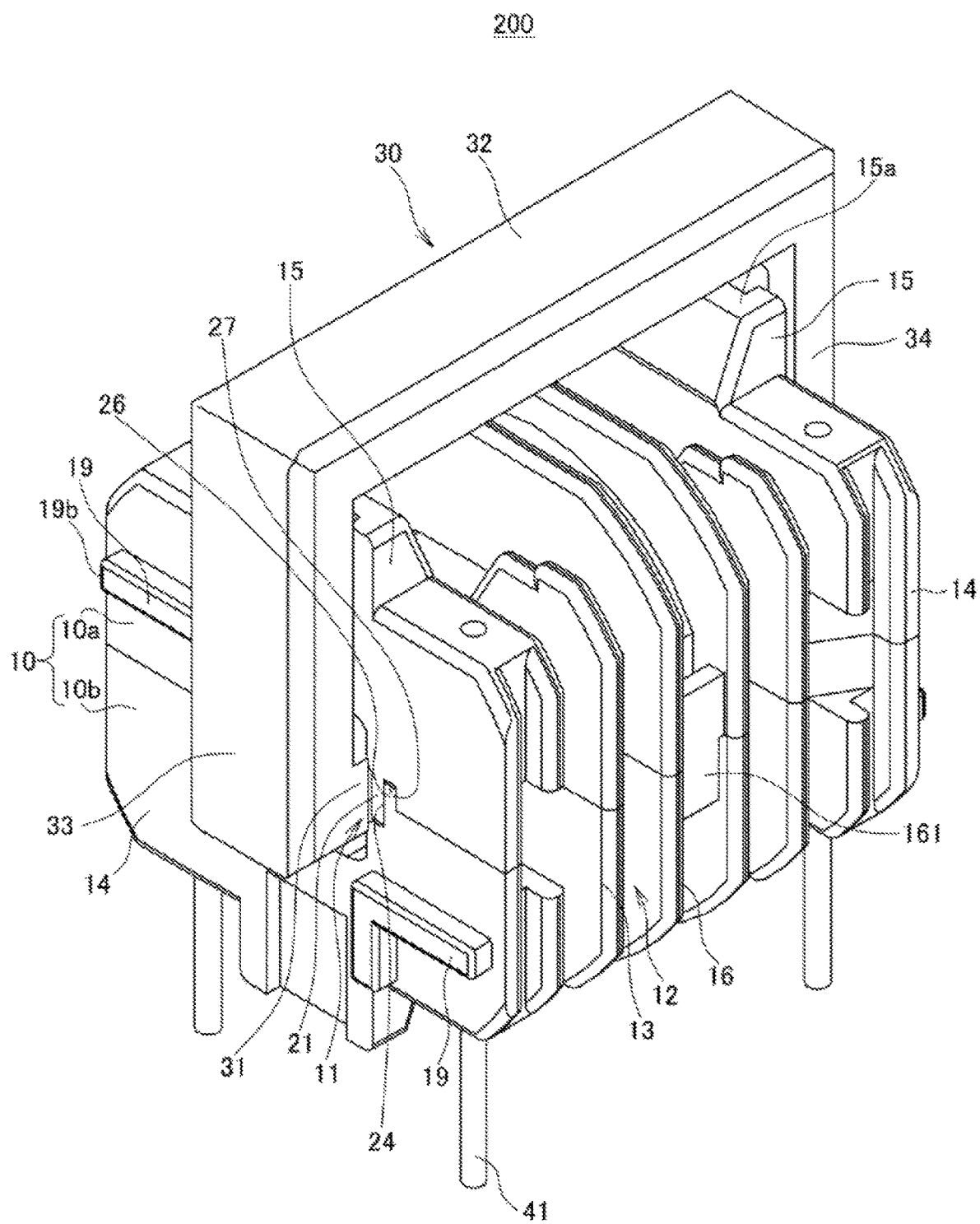
FIG. 2 is a perspective view that shows a state in which a first member, a second member, and a core that configure a filter component are assembled to each other according to the first embodiment of the present invention.

As shown in any of FIGS. 2-4, for instance, the bobbin 10 has flange-shaped end walls 14, a flange-shaped center wall 16, and flange-shaped partition walls 13. Specifically, the flange-shaped end walls 14 are respectively located at both ends in the axis direction of the bobbin 10. The flange-shaped center wall 16 is located at the center in the axis direction of the bobbin 10. Further, the flange-shaped partition walls 13 are located between the end walls 14 and the center wall 16, respectively.

As shown in FIG. 4, for instance, parts between the partition walls 13 and the end walls 14 of the bobbin 10 and parts between the partition walls 13 and the center wall 16 of the bobbin 10 configure wound parts 12 around which the wire 40 is wound (See FIG. 6).

As shown in FIG. 1, each of the first member 10a and the second member 10b has partition wall component ribs 13a, a pair of end wall components 14a, and a center wall component 16a.

In a state in which the bobbin 10 is configured by assembling the first member 10a and the second member 10b each other, the partition walls 13 are configured with the partition wall component ribs 13a of the first member 10a and the partition wall component ribs 13a of the second member 10b. The end walls 14 are configured with the end wall components 14a of the first member 10a and the end wall components 14a of the second member 10b. Further, the center wall 16 is configured with the center wall component 16a of the first member 10a and the center wall component 16a of the second member 10b.

For instance, an engaging pawl (claw) 161, an engaging projection 162, a boss 17, and a fitting hole 18 are formed at the center wall component 16a. In the state in which the first member 10a and the second member 10b are assembled to each other, the engaging pawl 161 of the first member 10a engages with the engaging projection 162 of the second member 10b, and at the same time, the engaging pawl 161 of the second member 10b engages with the engaging projection 162 of the first member 10a.

Further, in the state in which the first member 10a and the second member 10b are assembled to each other, the boss 17 of the first member 10a is fitted into the fitting hole 18 of the second member 10b, and at the same time, the boss 17 of the second member 10b is fitted into the fitting hole 18 of the first member 10a.

Further, a projection 15 and a rotation prevention member 19 are formed at the end wall component 14a. A projection 15 is formed at each of the two end wall components 14a of the first member 10a, and these projections 15 upwardly project from upper surfaces of the end wall components 14a. Further, a projection 15 is formed at each of the two end wall components 14a of the second member 10b, and these projections 15 downwardly project from lower surfaces of the end wall components 14a. A tip surface of each projection 15 corresponds to a flat surface 15a. The rotation prevention members 19 are formed at the end surfaces in the axis direction of the first member 10a and the second member 10b. Specifically, the rotation prevention member 19, for instance, corresponds to an L-shaped rib. That is, the rotation prevention member 19 is configured by a first rib 19a that extends vertically and a second rib 19b that extends horizontally.

As shown in FIG. 7, the first member 10a has a first recess projection 21 and a third recess (an opposite first recess inner wall) 23. Specifically, the first recess projection 21 rises (projects) from a surface of the first member 10a opposed to the second member 10b toward a side of the second member 10b, and at the same time, the first recess projection 21 configures a part of the first recess 11a. The third recess (the opposite first recess inner wall) 23 is opposed to the first recess projection 21 while sandwiching the first recess 11a therebetween. As shown in FIG. 7, a distance between the first recess projection 21 and the opposite first recess inner wall (the third recess) 23 is larger than a width of the first recess 11a in the width direction.

Further, the second member 10b has a second recess projection 22 and a fourth recess 24 (an opposite second recess inner wall). Specifically, the second recess projection 22 rises (projects) from a surface of the second member 10b opposed to the first member 10a toward a side of the first member 10a, and at the same time, the second recess projection 22 configures a part of the second recess 11b. The fourth recess 24 (the opposite second recess inner wall) is opposed to the second recess projection 22 while sandwiching the second recess 11b therebetween. As shown in FIG. 7, a distance between the second recess projection 22 and the opposite second recess inner wall (the fourth recess) 24 is larger than a width of the second recess 11b in the width direction. Further, in the assembled state, the first recess projection 21 is fitted into the fourth recess (the opposite second recess inner wall) 24, and at the same time, the second recess projection 22 is fitted into the third recess (the opposite first recess inner wall) 23 (refer to FIG. 8).

Further, the first member 10a has a third recess projection 25 in a position opposed to the first recess projection 21 while sandwiching the first recess 11a and the third recess (the opposite first recess inner wall) 23. That is, the third recess (the opposite first recess inner wall) 23 is formed at a side surface of the third recess projection 25. In addition, the first member 10a has a fifth recess 27 in a position being adjacent to an opposite side of the third recess projection 25 with respect to the first recess projection 21.

Similarly, the second member 10b has a fourth recess projection 26 in a position opposed to the second recess projection 22 while sandwiching the second recess 11b and the fourth recess (the opposite second recess inner wall) 24. That is, the fourth recess (the opposite second recess inner wall) 24 is formed at a side surface of the fourth recess projection 26. In addition, the second member 10b has a sixth recess 28 in a position being adjacent to an opposite side of the fourth recess projection 26 with respect to the second recess projection 22.

Further, in the assembled state, the third recess projection 25 is fitted into the sixth recess 28, and at the same time, the fourth recess projection 26 is fitted into the fifth recess 27 (refer to FIG. 8).

The first recess projection 21 and the third recess (the opposite first recess inner wall) 23, for instance, extend throughout an entire area of the first member 10a in the axis direction. Similarly, the second recess projection 22 and the fourth recess (the opposite second recess inner wall) 24, for instance, extend throughout an entire area of the second member 10b in the axis direction. Further, the third recess projection 25 and the fifth recess 27, for instance, extend throughout the entire area of the first member 10*a* in the axis direction. Similarly, the fourth recess projection 26 and the sixth recess 28, for instance, extend throughout the entire area of the second member 10*b* in the axis direction.

The core 30 is configured with a third extension part (bar) 33 and a fourth extension part (bar) 34 in addition to the first extension part (bar) 31 and the second extension part (bar) 32 explained above. Each of the first extension part 31, the second extension part 32, the third extension part 33, and the fourth extension part 34 is a bar-like (rod-like) member. The first extension part 31 and the second extension part 32, for instance, extend in parallel to each other. The third extension part 33 and the fourth extension part 34, for instance, extend in parallel to each other. Further, for instance, the third extension part 33 and the fourth extension part 34 are perpendicular to the first extension part 31 and the second extension part 32.

Each cross sectional shape of the first extension part 31, the second extension part 32, the third extension part 33, and the fourth extension part 34 is, for instance, a quadrilateral shape. Specifically, in the present embodiment, each cross sectional shape of the first extension part 31, the second extension part 32, the third extension part 33, and the fourth extension part 34 is a rectangular shape in which each corner is chamfered. Thus, the core 30 may have the chamfered corners.

Further, a cross sectional shape of (the boundary of) the through hole 11 is a quadrilateral shape corresponding to the cross sectional shape of the first extension part 31.

A terminal pin 41 is provided at the second member 10*b*. In the present embodiment, for instance, the two wires 40 are wound around the bobbin 10, separately, and four terminal pins 41 are provided at the second member 10*b*.

Further, the bobbin 10 of the filter component 100 and the filter component assembly kit 200 according to the present embodiment does not have the configuration corresponding to the gear that is provided with the filter component in Japanese Patent Publication No. H06-268465. Therefore, the miniaturization of the filter component 100 can be realized.

Next, a method for manufacturing a filter component according to an embodiment of the present invention will be explained below with reference to FIGS. 5A-5D and 6.

Figure 5A:
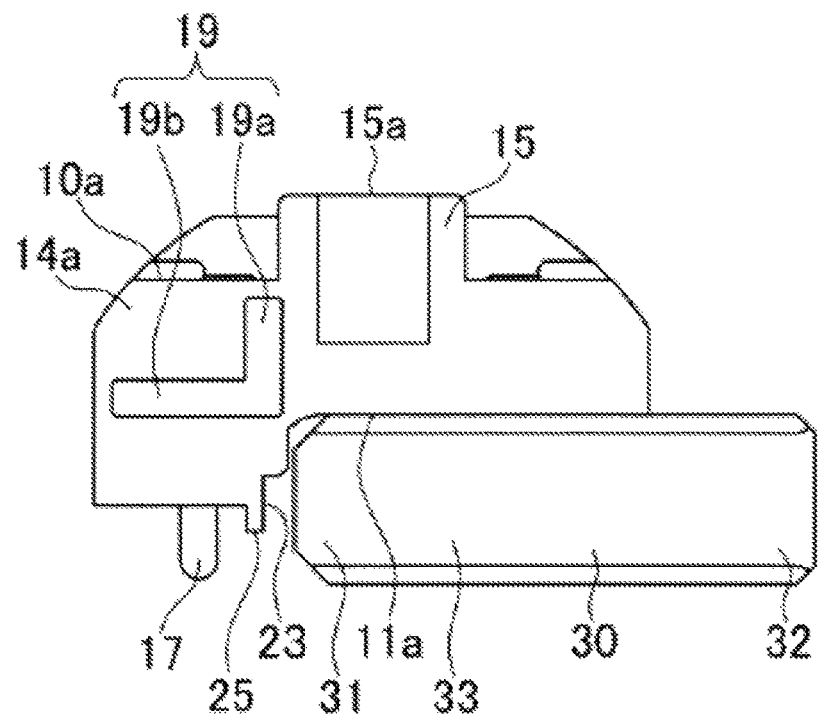
FIGS. 5A-5D are series process diagrams that explain a method for manufacturing a filter component according to the first embodiment of the present invention.

First, as shown in FIG. 5A, after laying the core 30 sideways for the first member 10*a*, the first extension part 31 of the core 30 is arranged in the first recess 11*a* of the first member 10*a*.

Figure 5B:
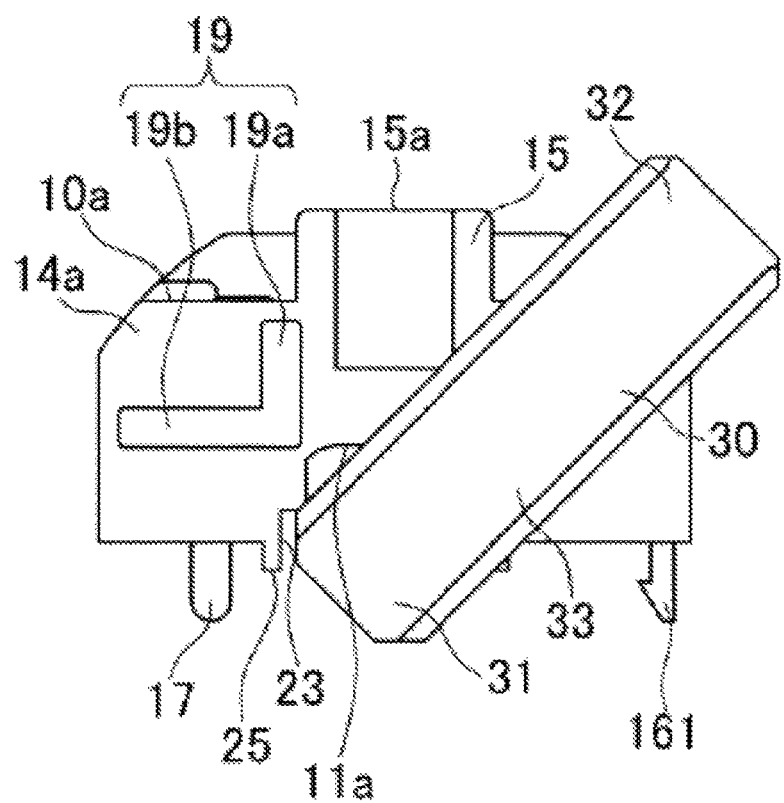
Figure 5C:
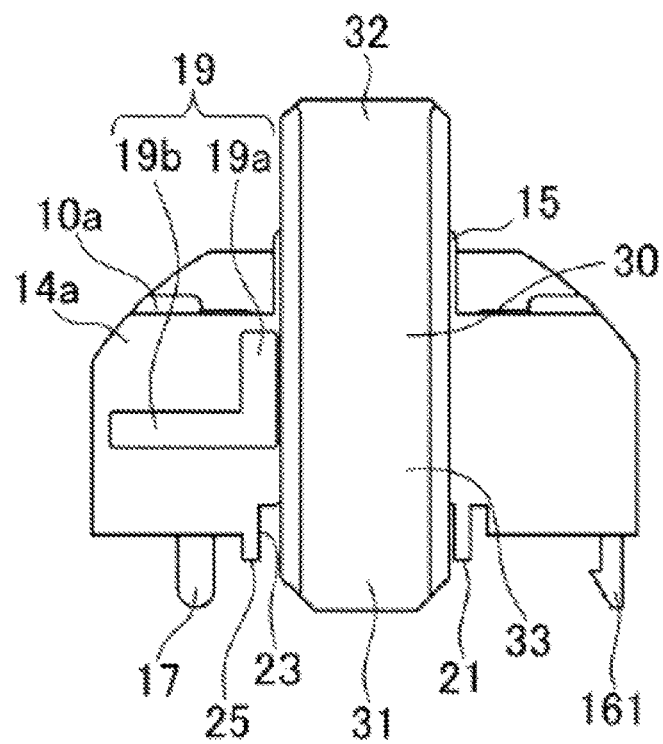

Next, as shown in FIGS. 5B and 5C, the core 30 is rotated relative to the first member 10*a* around a longitudinal axis of the first extension part 31 by making part of the first member 10*a* pass through an inner ring of the core 30. As a result, as shown in FIG. 5C, the first member 10*a* is located between the first extension part 31 and the second extension part 32 of the core 30.

When the core 30 is in a state shown in FIG. 5C by rotating the core 30 at an angle of 90 degrees from its initial state shown in FIG. 5A, the rotation of the core 30 is prevented because the third extension part 33 and the fourth extension part 34 of the core 30 contact the first rib 19*a* of the rotation prevention member 19 provided on both end surfaces of the first member 10*a*.

Figure 5D:
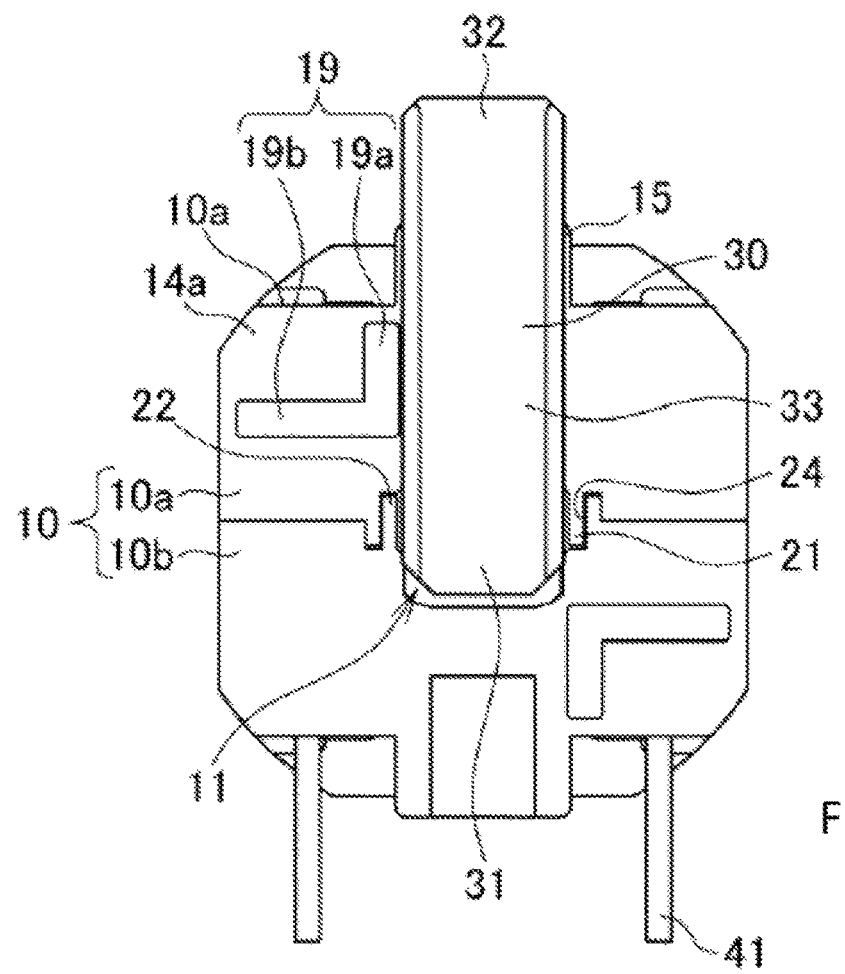

Next, as shown in FIG. 5D, the second member 10*b* is assembled to the first member 10*a*. As a result, the bobbin 10 is configured by the first member 10*a* and the second member 10*b*, and at the same time, the boundary of the through hole 11 is configured by the first recess 11*a* of the first member 10*a* and the second recess 11*b* of the second member 10*b*. At this time, the first extension part 31 is inserted into the through hole 11.

Further, as shown in FIG. 5D, the core 30 is relatively raised (pulled-up) with respect to the bobbin (the first extension part 31 moves to a side of the second extension part 32 in the through hole 11). As a result, a gap between the bobbin 10 (an upper surface of the first member 10*a*) and the second extension part 32 (an inner edge of the second extension part 32) increases. Further, while the gap between the second extension part 32 and the bobbin 10 is expanded (widens), a wire 40 is wound around the bobbin 10 by passing the wire 40 through the gap between the bobbin 10 and the second extension part 32. That is, the wire 40 is wound around the wound parts 12 of the bobbin 10. Therefore, because the wire 40 is wound while the gap between the second extension part 32 and the bobbin 10 is expanded (widens), a process, in which the wire 40 is wound around the bobbin 10, can be easily performed without using a gear.

Further, the first member 10*a* and the second member 10*b* can be adhered and fixed to each other by using an adhesive substance. Alternatively, the first member 10*a* and the second member 10*b* are not adhered and fixed to each other by using an adhesive substance (That is, it can also be adopted that the first member 10*a* and the second member 10*b* are only bound by the wound wire 40).

Next, the core 30 is relatively lowered with respect to the bobbin 10 (the first extension part 31 moves to an opposite side with respect to the second extension part 32 in the through hole 11). Thereafter, the first extension part 31 is adhered and fixed to the boundary of the through hole 11 by using an adhesive substance.

Further, because the rotation of the core 30 relative to the bobbin 10 is prevented around the longitudinal axis of the first extension part 31, the core 30 can be stably held by the bobbin 10 during the process in which the wire 40 is wound around the bobbin 10. At the same time, after the wire 40 is wound around the bobbin 10, the first extension part 31 can be adhered to the boundary of the through hole 11 in the state in which the core 30 is accurately positioned with respect to the bobbin 10.

Further, for instance, two of the wire 40 are wound around the bobbin 10. That is, one wire 40 is wound on one side with respect to the center wall 16 as a boundary, and the other wire 40 is wound on the other side with respect to the center wall 16 as the boundary. Then, both ends of each of the wires 40 are respectively and electrically connected to the terminal pins 41. Further, the terminal pins 41 can be attached to the second member 10*b* in advance before the wires 40 are wound around the bobbin 10. Alternatively, the terminal pins 41 can be attached to the second member 10*b* after the wires 40 are wound around the bobbin 10. Further, alternatively, the terminal pins 41 can be attached to the second member 10*b* while the wires 40 are wound around the bobbin 10.

As a result, the filter component 100 shown in FIG. 6 can be obtained. As explained above, the filter component 100 according to the present embodiment of the present invention corresponds to the filter component 100 that is assembled by using the filter component assembly kit 200 according to the present embodiment of the present invention. Specifically, the filter component 100 is configured with the first member 10*a*, the second member 10*b* and the core 30 that are in the assembled state, and the wire(s) 40 that is (are) wound around the bobbin 10. Further, the first extension part (bar) 31 of the core 30 is fixed to the boundary of the through hole 11.

A method for manufacturing a filter component according to the present embodiment of the present invention is a method for manufacturing the filter component 100 and will be explained below. Specifically, the filter component 100 has the bobbin 10 having the through hole 11 that is formed by assembling the first member 10*a* and the second member 10*b* to each other, the core 30 that is formed in a monolithic (molding) body being a rectangular shaped frame (in a quadrangular frame shape), and the wire(s) 40 that is (are) wound around the bobbin 10. This method has the following processes.

An assembling process is that the first member 10*a*, the second member 10*b*, and the core 30 are assembled to each other, and the first extension part 31 of the core 30 is located by inserting through the through hole 11, and at the same time, the second extension part 32 is located at the outside of the through hole 11. Further, a winding process is that the first extension part 31 moves to a side of the second extension part 32 (in the present embodiment, the upper side) within the through hole 11, and as a result, a gap between the bobbin 10 (an upper surface of the first member 10*a*) and the second extension part 32 (an inner edge of the second extension part 32) increases, and while the gap between the second extension part 32 and the bobbin 10 is expanded (widens), the wire 40 is wound around the bobbin 10 by passing the wire 40 through the gap between the bobbin 10 and the second extension part 32. Lastly, a moving process is that the first extension part 31 moves to the opposite side (in the present embodiment, the lower side) with respect to the second extension part 32 within the through hole 11.

Further, the assembling process explained above includes the following three processes. A first process is that the first extension part 31 is positioned to the first recess 11*a*. A second process is that the first member 10*a* is positioned between the first extension part 31 and the second extension part 32 by making the core 30 rotate with respect to the first member 10*a* around the longitudinal axis of the first extension part 31. Lastly, a third process is that the first member 10*a* and the second member 10*b* are assembled to each other so that the first extension part 31 is located by inserting through the through hole 11, and at the same time, the second extension part 32 is located at the outside of the through hole 11.

Further, the method for manufacturing the filter component according to the present embodiment of the present invention has a fixing process in which the first extension part 31 is adhered and fixed to the boundary of the through hole 11 after the first extension part 31 moves to the opposite side with respect to the second extension part 32 in the through hole 11.

As explained above, when the first extension part 31 is arranged in the first recess 11*a*, the core 30 can rotate relative to the first member 10*a* around the longitudinal axis of the first extension part 31. For instance, in the state in which the first extension part 31 always contacts the bottom surface (the top surface of the first recess 11*a* in FIGS. 5A-5C) of the first recess 11*a*, the core 30 can rotate relative to the first member 10*a* around the longitudinal axis of the first extension part 31.

Further, the first member 10*a* has the rotation prevention member 19 at the outside of the first recess 11*a*. Specifically, the rotation prevention member 19 prevents the rotation of the core 30 relative to the first member 10*a* in regards to the rotational angle when the second member 10*b* is assembled to the first member 10*a*.

Specifically, when the first member 10*a*, the second member 10*b*, and the core 30 are assembled to each other as shown in FIG. 5D, the rotation of the core 30 relative to the bobbin 10 is prevented around the longitudinal axis of the first extension part 31.

As shown in FIG. 8, in the present embodiment, with respect to a cross section of the first extension part 31 which is orthogonal to the longitudinal direction of the first extension part 31, a circumscribed circle 36 of the cross section of the first extension part 31 exceeds from a cross section of the boundary of the through hole 11 which is orthogonal to the longitudinal direction of the first extension part 31. As a result, when the core 30 is made to be rotated relative to the bobbin 10, the rotation of the core 30 relative to the bobbin 10 is prevented because an outer circumference surface of the first extension part 31 and an inner circumference surface of the boundary of the through hole 11 interfere (abut) to each other.

Specifically, when the core 30 is made to be rotated relative to the bobbin 10 around the longitudinal axis of the first extension part 31, the first extension part 31, the rotation of the core 30 relative to the bobbin 10 is prevented because the first recess projection 21, and the second recess projection 22 interfere (abut) to each other.

Figure 9:
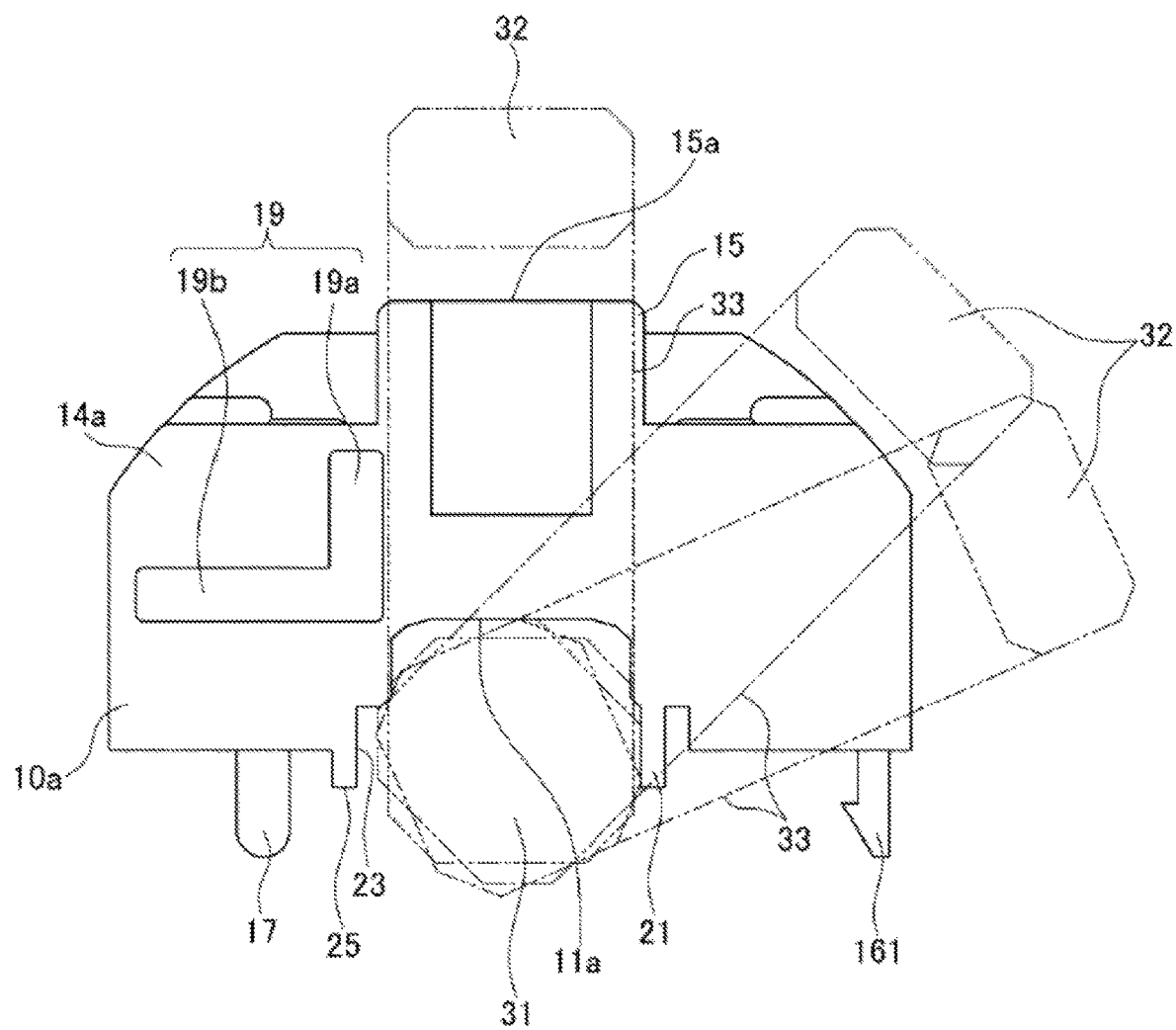
FIG. 9 is a view that shows a positional relationship of each part when a core rotates with respect to a first member according to the first embodiment of the present invention.

On the other hand, as shown in FIG. 9, when the core 30 is made to be rotated relative to the first member 10*a* after the first extension part 31 is arranged in the first recess 11*a* of the first member 10*a* (the processes from FIG. 5A to FIG. 5C), the core 30 can rotate relative to the first member 10*a* because the corner of the first extension part 31 can invade into the third recess (an opposite first recess inner wall) 23. That is, before the second member 10*b* is assembled to the first member 10*a*, the second recess projection 22 of the second member 10*b* is not placed into the third recess (an opposite first recess inner wall) 23. Therefore, the rotation of the core 30 relative to the first member 10*a* is allowed.

As shown in FIG. 5D, in the state in which the first member 10*a*, the second member 10*b*, and the core 30 are assembled to each other, a vertical dimension of the boundary of the through hole 11 is larger than a vertical dimension of the first extension part 31. As a result, the first extension part 31 can vertically move in the through hole 11. That is, the core 30 can vertically move relative to the bobbin 10.

Further, a movable length (a first moving length) by which the core 30 can vertically move (in a vertical direction in FIG. 3) relative to the bobbin 10 is longer than a movable length (a second moving length) by which the core 30 can move in an orthogonal direction (explained above) orthogonal to the vertical direction (a right and left (horizontal or crosswise) direction in FIG. 3) relative to the bobbin 10. That is, in regards to the clearance (allowance (freedom of movement)) between the outer circumference surface of the first extension part 31 and the inner circumference surface of the boundary of the through hole 11, the clearance (allowance (freedom of movement)) in the vertical direction is larger than the clearance (allowance (freedom of movement)) in the orthogonal direction explained above (the right and left (horizontal or crosswise) direction in FIG. 3).

Further, a width dimension of the first extension part 31 in the orthogonal direction (the right and left (horizontal or crosswise) direction in FIG. 3) orthogonal to both the facing direction (the vertical direction in FIG. 3) of the first extension part 31 and the second extension part 32 and the longitudinal direction (the depth direction in FIG. 3) of the first extension part 31 can be larger than the dimension of the boundary of the through hole 11 in the facing direction (the vertical direction in FIG. 3). That is, therefore, the rotation of the core 30 relative to the bobbin 10 can also be prevented. In addition, the width dimension of the boundary of the through hole 11 in the orthogonal direction (the right and left (horizontal or crosswise) direction in FIG. 3) is larger than the (height) dimension of the first extension part 31 in the facing direction (the vertical direction in FIG. 3). As a result, as explained above, after the core 30 is put sideways (lay on its side) with respect to the first member 10a, the first extension part 31 of the core 30 can be placed in the first recess 11a of the first member 10a.

Thus, in the present embodiment, as explained above, the assembling direction of the first member 10a and the second member 10b corresponds to the facing direction (the vertical direction in FIG. 3). Therefore, in the assembled state, the first member 10a is located between the first extension part 31 and the second extension part 32.

Further, it is preferred that a distance D is longer than a distance L as shown in FIG. 3. That is, at the center position of the through hole 11 in the orthogonal direction (the right and left (horizontal or crosswise) direction in FIG. 3), a sum of the dimension of the first member 10a and the dimension of the boundary of the through hole 11 in the facing direction (the vertical direction in FIG. 3) corresponds to L. In other words, in FIG. 3, the distance between the flat surface (upper surface) 15a of the projection 15 of the first member 10a and the bottom surface of the boundary of the through hole 11 (the bottom surface of the second recess 11b of the second member 10b) corresponds to L. On the other hand, the distance between the surface of the second extension part 32 facing the first extension part 31 (the lower surface of the second extension part 32 in FIG. 3) and the surface of the first extension part 31 facing the opposite side with respect to the second extension part 32 (the lower surface of the first extension part 31 in FIG. 3) corresponds to D. In other words, in FIG. 3, the distance between an inner edge of the second extension part 32 and an outer edge of the first extension part 31 in the facing direction (the vertical direction in FIG. 3) corresponds to D. It is preferred that the following expression is satisfied: L<D. According to the configuration explained above, the core 30 and the bobbin 10 can be suitably assembled.

Further, it is preferred that a distance R is longer than the distance L shown in FIG. 3. When the bobbin 10 is viewed in the axis direction (such as the depth direction in FIG. 3), the distance R corresponds to a distance between the center position in the orthogonal direction (the right and left (horizontal or crosswise) direction in FIG. 3) on the bottom surface of the boundary of the through hole 11 (the second recess 11b) and a farthest position of the bobbin 10 from the center position mentioned above. According to the configuration explained above, the rotation of the core 30 relative to the bobbin 10 around the longitudinal axis of the first extension part 31 is prevented as well.

Further, in the assembled state explained above, on a second extension part side counterface surface of the bobbin 10 facing the second extension part 32 (an upper surface of the bobbin 10 in FIG. 4), a projection 15 that projects on a side of the second extension part 32 is formed at least one end of both ends of the upper surface of the bobbin 10 in the longitudinal direction of the first extension part 31 (in the present embodiment, the projections 15 are formed at both ends). Thus, a distance between an intermediate point with respect to both ends of the second extension part side counterface surface of the bobbin 10 and (the inner edge of) the second extension part 32 is longer than a distance between (a tip of) the projection 15 and (the inner edge of) the second extension part 32. As a result, the winding operation in which the wire(s) 40 is (are) wound around the bobbin 10 by passing the wire 40 through the gap between the second extension part 32 and the bobbin 10 can be more easily performed.

In addition, because the bobbin 10 has the projection 15, the core 30 can be stably held by the bobbin 10 in the state in which the core 30 is positioned relative to the first member 10a as shown in FIG. 5C. In particular, because a tip (upper) surface of the projection 15 is the flat surface 15a, the core 30 can be more stably held by the bobbin 10.

According to the first embodiment of the present invention explained above, in the assembled state explained above, because the first extension part 31 can move in the facing direction of the first member 10a and the second member 10b (the vertical direction in FIG. 3) in the through hole 11, the gap between the second extension part 32 and the bobbin 10 can be expanded (widen) when the wire(s) 40 is (are) wound around the bobbin 10. Therefore, because the winding of the wire 40 around the bobbin 10 can be easily performed without using a gear, the gear is not required for the filter component 100. As a result, the miniaturization of the filter component 100 can be realized.

In particular, because the first moving length (a relative movable length of the bobbin 10 and the core 30 in the vertical direction in FIG. 3) is longer than the second moving length (a relative movable length of the bobbin 10 and the core 30 in the right and left (horizontal or crosswise) direction in FIG. 3) as explained above, the gap between the second extension part 32 and the bobbin 10 can be sufficiently expanded (widen).

Further, in addition, in the assembled state explained above, the rotation of the core 30 relative to the bobbin 10 is prevented around the longitudinal axis of the first extension part 31. As a result, the core 30 can be stably held by the bobbin 10 during the winding process in which the wire(s) 40 is (are) wound around the bobbin 10. Further, at the same time, after the wire(s) 40 is (are) wound around the bobbin 10, the first extension part 31 can be adhered to the boundary of the through hole 11 in the state in which the core 30 is accurately positioned with respect to the bobbin 10.

First Variation of the First Embodiment

Figure 14:
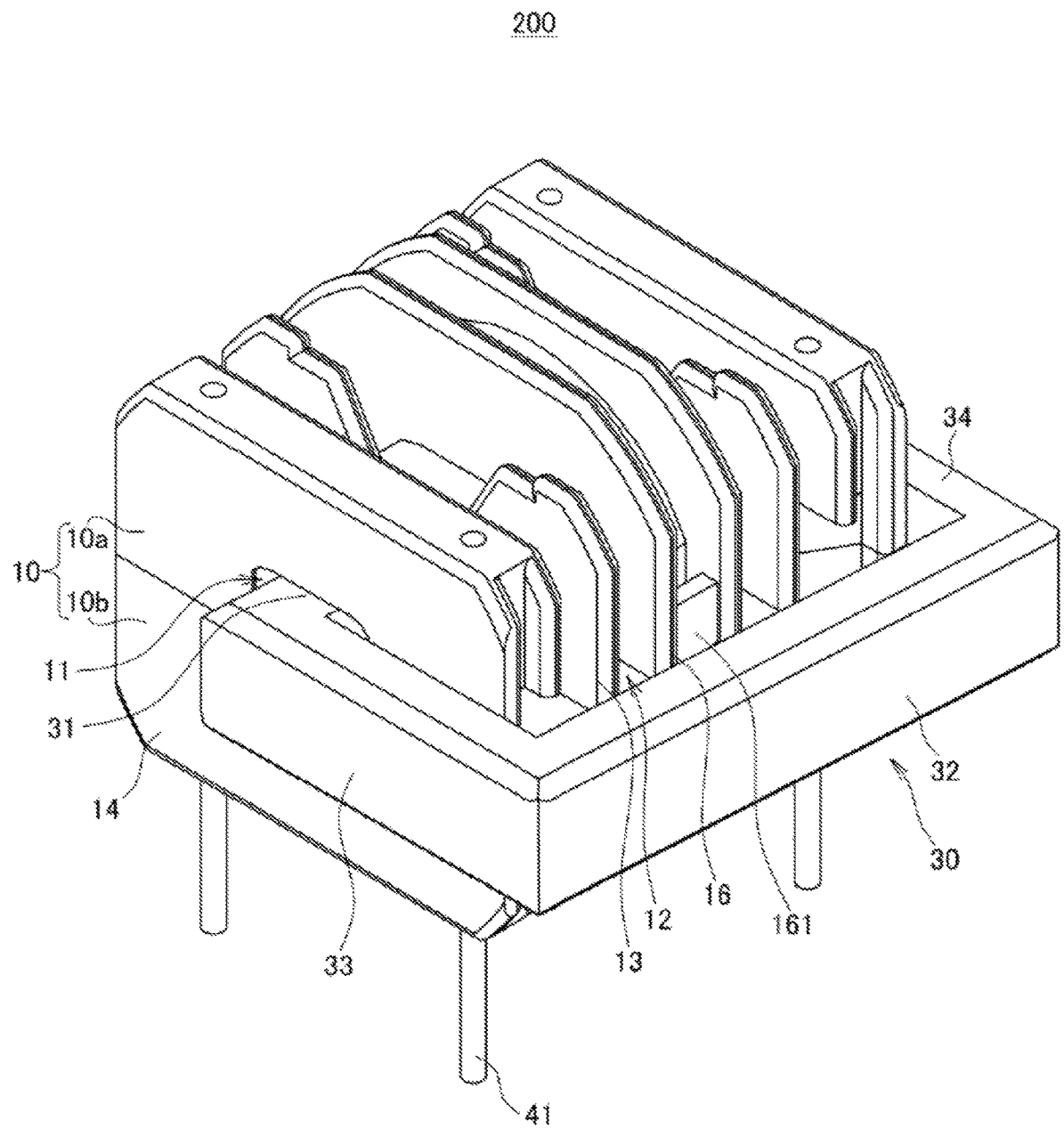
FIG. 14 is a perspective view that shows a state in which a first member, a second member, and a core that configure a filter component are assembled to each other according to a first variation of the first embodiment of the present invention.

Next, a first variation of the first embodiment according to the present invention will be explained below with reference to FIG. 14. In the first embodiment explained above, the example in which the assembling direction of the first member 10a and the second member 10b corresponds to the facing direction of the first extension part 31 and the second extension part 32 of the core 30 is explained. In the present variation, the assembling direction of the first member 10a and the second member 10b and the facing direction of the first extension part 31 and the second extension part 32 of the core 30 cross to each other (for instance, orthogonal to each other). That is, in the present variation, the facing direction explained above corresponds to a vertical direction. Further, the facing direction explained above corresponds to a horizontal direction.

In this case, a first moving length in which the first extension part 31 can move horizontally in the through hole 11 is larger than a second moving length in which the first extension part 31 can move vertically in the through hole 11. In the present variation, although a horizontal dimension of the filter component is larger, a height dimension of the filter component can be smaller as compared with the first embodiment explained above.

Second Variation of the First Embodiment

Figure 15:
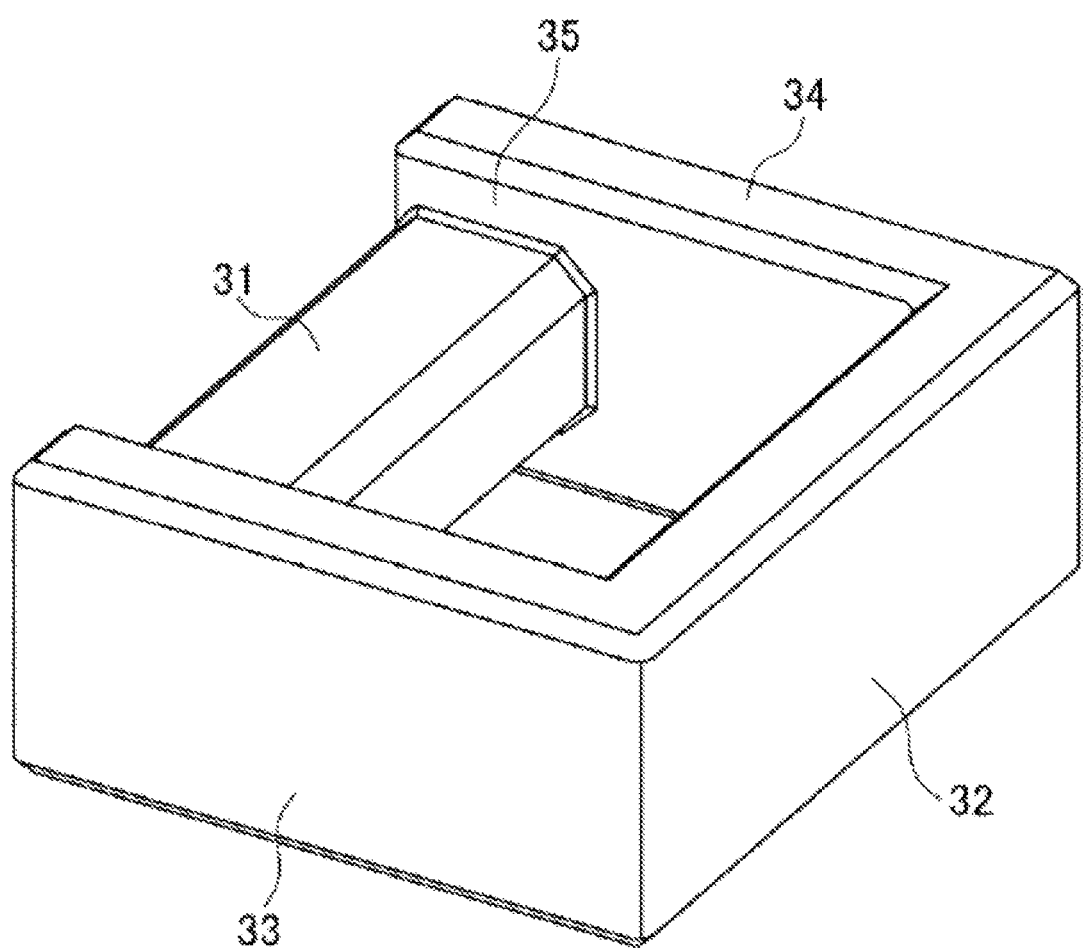
FIG. 15 is a perspective view that shows a core of a filter component according to a second variation of the first embodiment of the present invention.

Next, a second variation of the first embodiment according to the present invention will be explained below with reference to FIG. 15. In the present variation, as shown in FIG. 15, width dimensions of the second extension part 32, the third extension part 33, and the fourth extension part 34 in the orthogonal direction explained above (the right and left (horizontal or crosswise) direction in FIG. 3) are larger than a width dimension of the first extension part 31 in the orthogonal direction explained above. That is, steps 35 are formed at boundaries between both ends of the first extension part 31 and the third extension part 33 and the fourth extension part 34.

As a result, because a thickness of the second extension part 32 in the facing direction can be suppressed (smaller), a height dimension of the filter component 100 can be smaller as compared with the first embodiment. Further, because thicknesses of the third extension part 33 and the fourth extension part 34 in the axis direction of the bobbin 10 can be suppressed (smaller), a dimension of the filter component 100 in the axis direction of the bobbin 10 can also be smaller as compared with the first embodiment.

Third Variation of the First Embodiment

Figure 16:
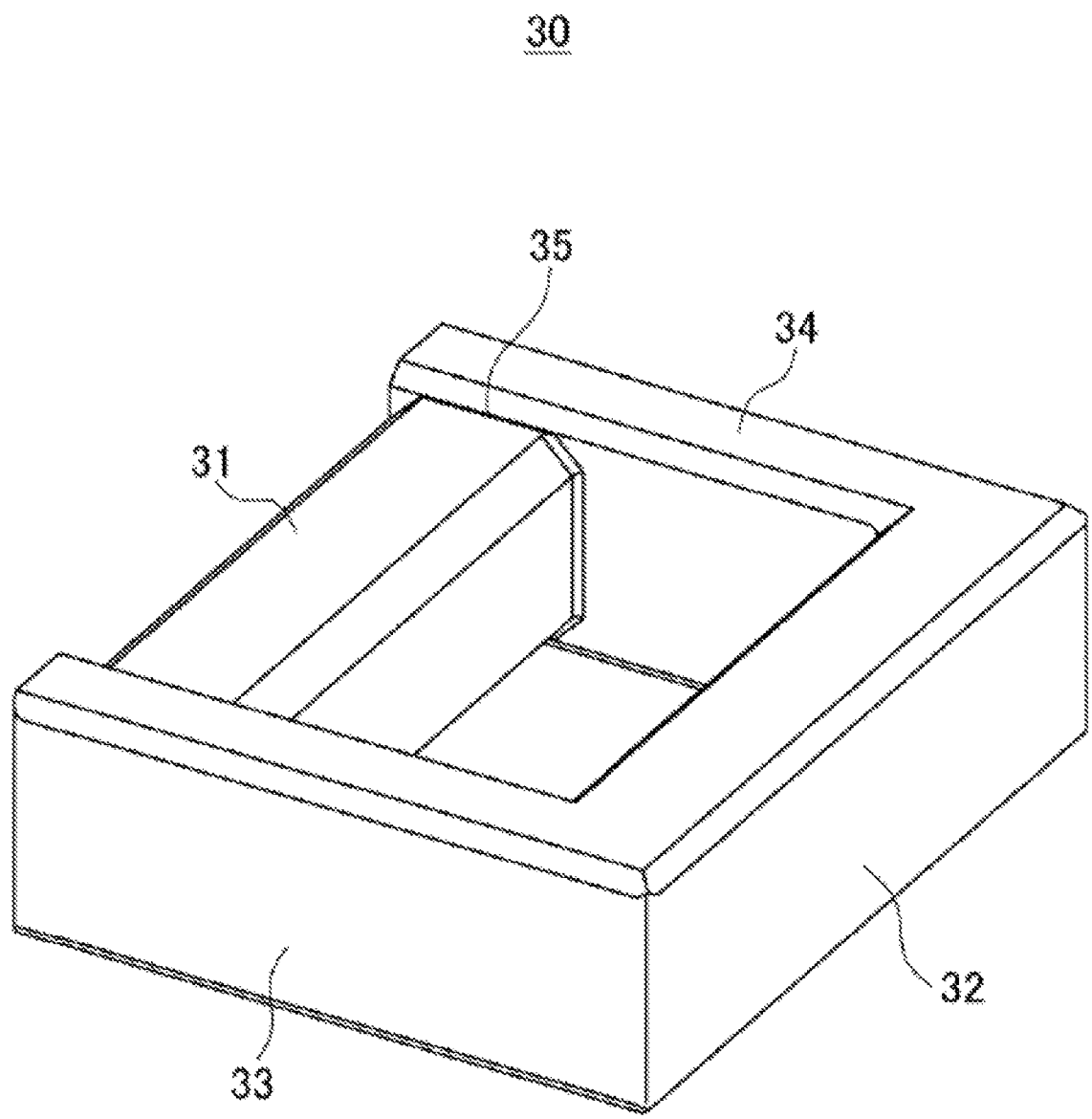
FIG. 16 is a perspective view that shows a core of a filter component according to a third variation of the first embodiment of the present invention.

Next, a third variation of the first embodiment according to the present invention will be explained below with reference to FIG. 16. In the second variation shown in FIG. 15, the steps 35 are formed at a deeper (lower) position from the chamfered corners of the third extension part 33 and the fourth extension part 34. On the other hand, in the present variation, the steps 35 are formed so as to correspond to edges of the chamfered corners of the third extension part 33 and the fourth extension part 34. In the present variation, a height dimension of the filter component 100 can be smaller, and at the same time, a dimension of the filter component 100 in the axis direction of the bobbin 10 can be smaller as compared with the first embodiment explained above.

Second Embodiment

Next, a second embodiment according to the present invention will be explained below with reference to FIGS. 10-13.

Figure 11:
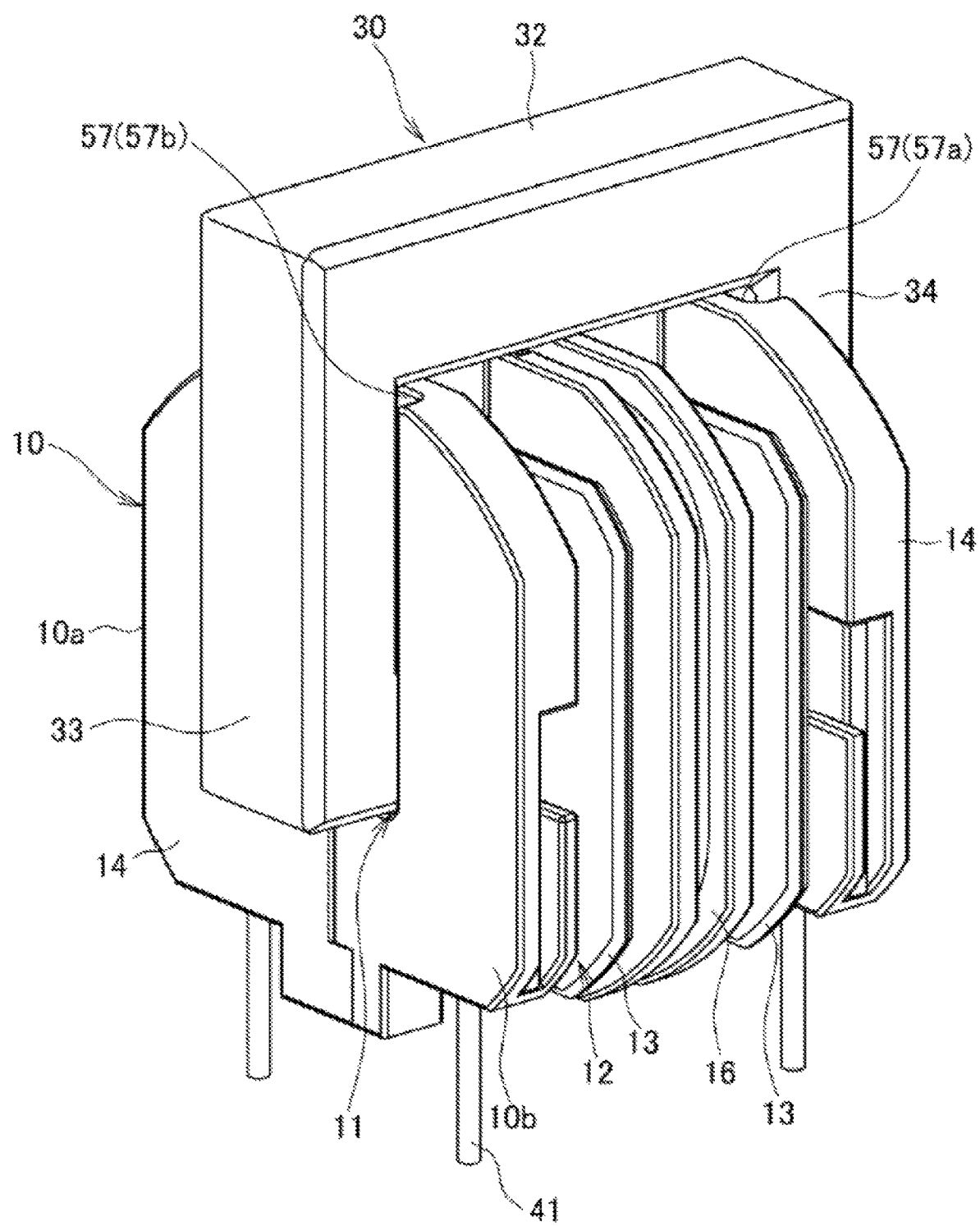
FIG. 11 is a perspective view that shows a state in which a first member, a second member, and a core that configure a filter component are assembled to each other according to the second embodiment of the present invention.
Figure 12:
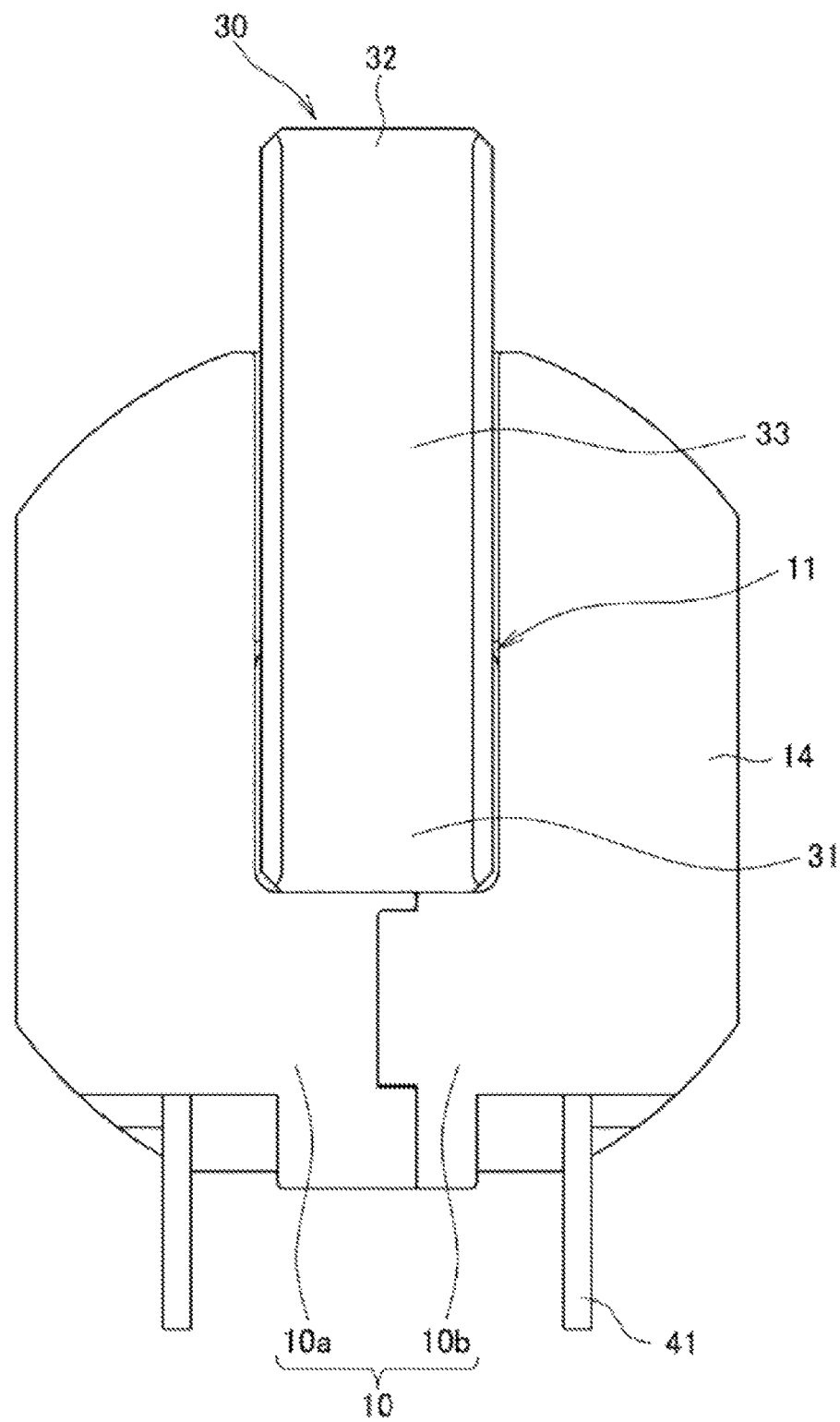
FIG. 12 is a front view that shows a state in which a first member, a second member, and a core that configure the filter component are assembled to each other according to the second embodiment of the present invention.

In the first embodiment explained above, the assembling direction of the first member 10a and the second member 10b which configure the bobbin 10 corresponds to the vertical direction. In contrast, in the present embodiment, an assembling direction of a first member 10a and a second member 10b corresponds to a horizontal direction as shown in FIGS. 10-12.

However, the core 30 is arranged in a position in which a third extension part 33 and a fourth extension part 34 extend in a vertical direction in the same manner as the first embodiment. Therefore, a facing direction of the first extension part 31 and the second extension part 32 and an assembling direction (a dividing direction) of the first member 10a and the second member 10b cross to each other (for instance, orthogonal to each other). Therefore, as shown in FIG. 10, a first recess 11a of the first member 10a and a second recess 11b of the second member 10b are respectively opened toward the horizontal direction.

Figure 10:
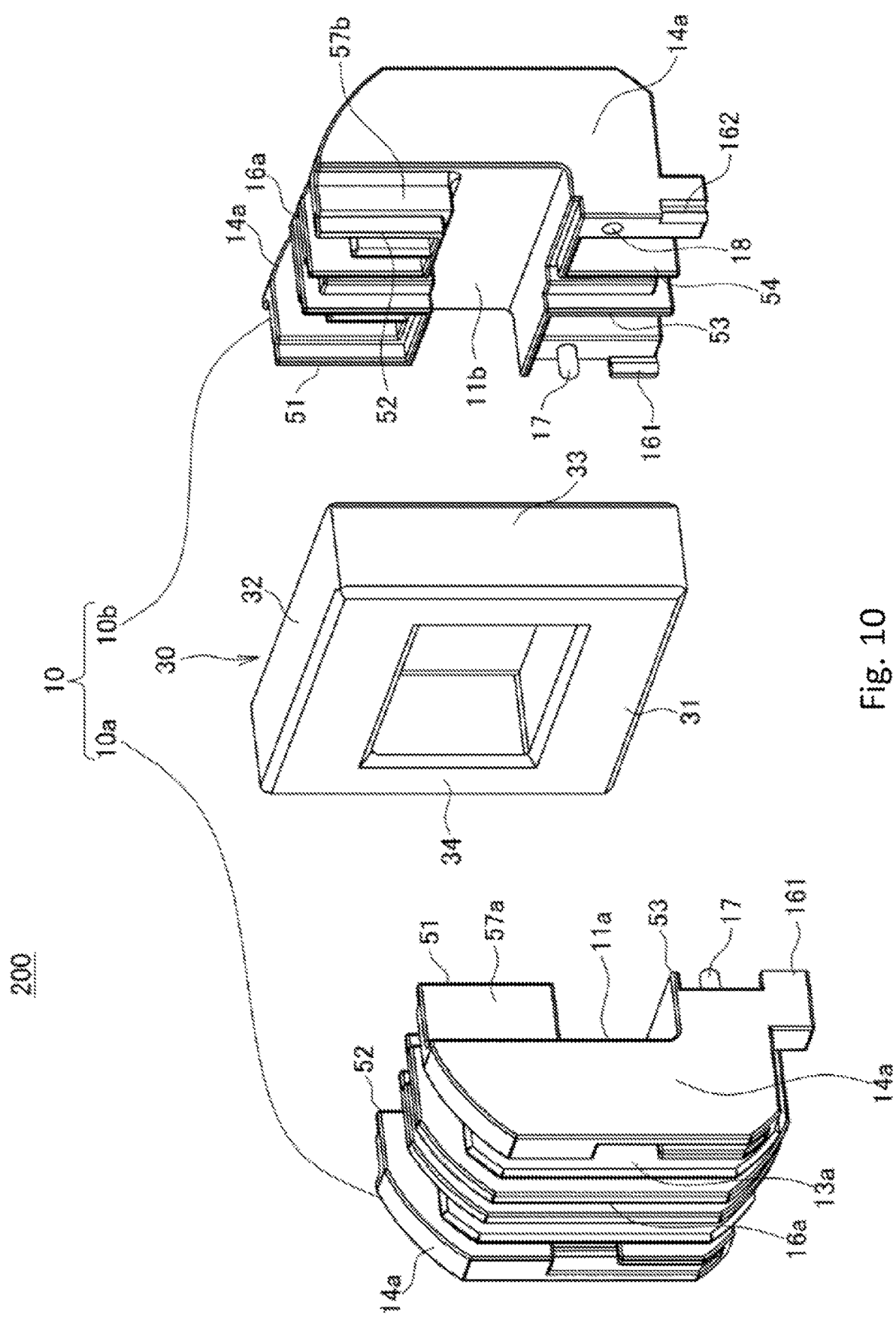
FIG. 10 is an exploded perspective view that shows a first member, a second member, and a core that configure a filter component according to a second embodiment of the present invention.

As shown in FIG. 10, in the present embodiment, in regards to a surface of the second member 10b opposed to the first member 10a, a first upper projection (plate) 51 and a second upper projection (plate) 52 that respectively project toward a side of the first member 10a are formed on an upper portion of the second recess 11b. Further, in regards to the surface of the second member 10b opposed to the first member 10a, a first lower projection (plate) 53 and a second lower projection (plate) 54 that respectively project toward the side of the first member 10a are formed on an lower portion of the second recess 11b.

Similarly, in regards to a surface of the first member 10a opposed to the second member 10b, the first upper projection 51, the second upper projection 52, the first lower projection 53, and the second lower projection 54 are formed as shown in FIG. 10.

The first upper projection 51 and the second upper projection 52 are located in the position opposed to each other. In a state in which the first member 10a and the second member 10b are assembled to each other, the first upper projection 51 and the second upper projection 52 are fitted to each other. Similarly, the first lower projection 53 and the second lower projection 54 are located in the position opposed to each other. In the state in which the first member 10a and the second member 10b are assembled to each other, the first lower projection 53 and the second lower projection 54 are fitted to each other.

In the present embodiment, in the assembled state in which the first member 10a, the second member 10b, and the core 30 are assembled to each other (FIGS. 11-13), the core 30 can relatively and vertically move relative to the bobbin 10 as well. Further, a first moving length in which the first extension part 31 can relatively and vertically move in the through hole 11 is longer than a second moving length in which the first extension part 31 can relatively and horizontally move in the through hole 11.

Figure 13:
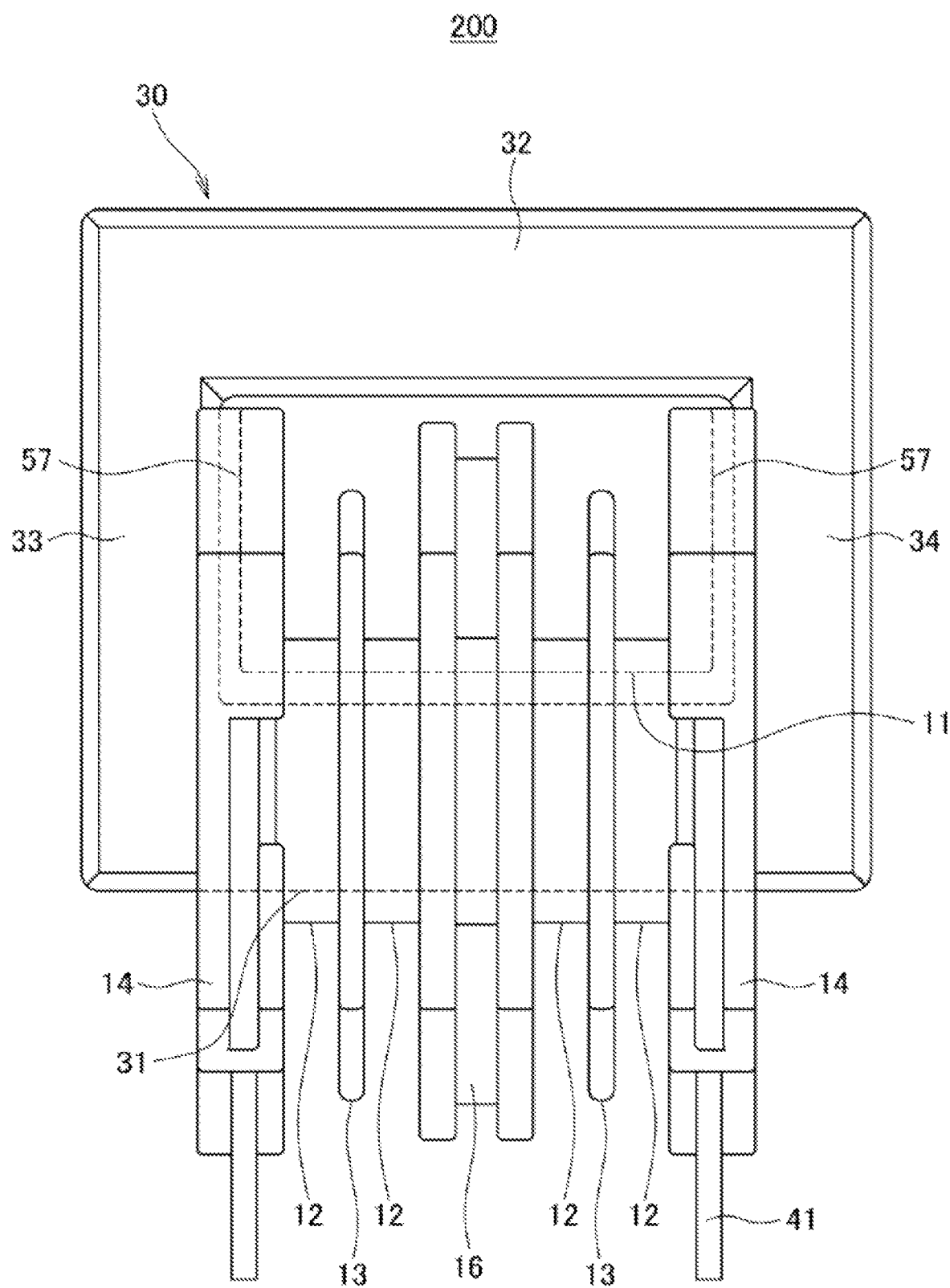
FIG. 13 is a side view that shows a state in which a first member, a second member, and a core that configure the filter component are assembled to each other according to the second embodiment of the present invention.

Further, as shown in FIG. 13, a fitting recess 57, which is fitted to the third extension part 33, is formed on one end surface of both end surfaces of the bobbin 10 in the axis direction of the through hole 11. Further, another fitting recess 57, which is fitted to the fourth extension part 34, is formed on the other end surface.

However, the present invention is not limited to the above configuration. That is, the fitting recess 57, which is fitted to the third extension part 33 or the fourth extension part 34, can also be formed at least on one end surface of both end surfaces of the bobbin 10 in the axis direction of the through hole 11.

In other words, the core 30 has the third extension part 33 and the fourth extension part 34 that extend in parallel to each other. Further, the third extension part 33 and the fourth extension part 34 respectively extend in the crossing direction with respect to the extension directions of the first extension part 31 and the second extension part 32. Thus, at least one end surface of both end surfaces of the bobbin 10 in the axis direction of the through hole 11 has the fitting recess 57, which is fitted to one of the third extension part 33 and the fourth extension part 34. As a result, the dimension of the filter component in the axis direction of the through hole 11 can be made small.

Specifically, as shown in FIG. 10, a recess 57a is formed at the first upper projection 51 of the first member 10a, and a recess 57b is formed at the second upper projection 52 of the second member 10b. Further, because the recess 57a and the recess 57b are fitted by assembling the first member 10a and the second member 10b, one of the fitting recesses 57

(shown in FIG. 13) is configured. Thus, part of an inner surface side of the third extension part 33 is fitted to the fitting recess 57.

Further, though an illustration is omitted from the drawings, the recess 57b is formed at the second upper projection 52 of the first member 10a, and the recess 57a is formed at the first upper projection 51 of the second member 10b. Because the recess 57a and the recess 57b are fitted by assembling the first member 10a and the second member 10b, the other of the fitting recess 57 (shown in FIG. 13) is configured. Thus, part of an inner surface side of the fourth extension part 34 is fitted to the fitting recess 57.

As explained above, in the present embodiment, the assembling direction of the first member 10a and the second member 10b and the facing direction (of the first and second extension parts 31 and 32) explained above cross to each other. Further, the fitting recesses 57 are configured by a first fitting recess component (the recesses 57a and 57b) being formed at the first member 10a and a second fitting recess component (the recesses 57a and 57b) being formed at the second member 10b.

The present embodiments according to the present invention include the following technical ideas and concepts.

A filter component assembly kit comprising: a bobbin including a first member connected to a second member so that a through hole is formed in a center of the bobbin, the through hole extending in a first direction; and a core that is in a quadrangular frame shape, the core being configured with first, second, third, and fourth extension bars, the first and second extension bars extending in parallel in the first direction, the third and fourth extension bars extending in parallel in a second direction, the second direction being perpendicular to the first direction. Further, when the first extension bar is disposed in the through hole of the bobbin, rotation of the core around the first extension bar is prevented. First allowance of the first extension bar in the second direction in the through hole is larger than second allowance of the first extension bar in a third direction in the through hole, the third direction being perpendicular to the first and second directions.

In the filter component assembly kit, a cross section of the first extension bar is quadrangular. Further, a cross section of a boundary of the through hole is quadrangular. A width of the first extension bar in the third direction is larger than an inner dimension of the boundary of the through hole in the second direction. An inner dimension of the boundary of the through hole in the third direction is larger than a width of the first extension bar in the second direction.

In the filter component assembly kit, a circumscribed circle of a cross section of the first extension bar exceeds from a cross section of the boundary of the through hole, the cross section of the first extension bar extending in the second and third directions, the cross section of the boundary of the through hole extending in the second and third directions.

In the filter component assembly kit, the first and second members of the bobbin have first and second recesses, respectively. The first and second recesses configure the boundary of the through hole when the first member is assembled with the second member. Further, when the first extension bar is disposed in the first recess without assembling the first member with the second member, the core is rotatable around the first extension bar with respect to the first member.

In the filter component assembly kit, the first member has a rotation prevention member at a position that is offset from the first recess. Further, the rotation prevention member prevents rotation of the core around the first extension bar when the first extension bar is disposed in the through hole.

In the filter component assembly kit, the first member has a first recess projection projecting toward the second member and an opposite first recess inner wall. The first recess projection partially configures the first recess. The opposite first recess inner wall is opposed to the first recess projection while sandwiching the first recess therebetween. Further, the second member has a second recess projection projecting toward the first member and an opposite second recess inner wall. The second recess projection partially configures the second recess. The opposite second recess inner wall is opposed to the second recess projection while sandwiching the second recess therebetween. Further, when the first member is assembled with the second member and when the first extension bar is disposed in the through hole, the first and second recess projections engage with the opposite second and first recess inner walls of the second and first recesses, respectively, so as to prevent the core from rotating around the first extension bar by abutting the first extension bar against the first and second recess projections.

In the filter component assembly kit, an assemble direction of the first and second members corresponds to the second direction. When the first member is assembled with the second member and when the first extension bar is disposed in the through hole, the first member is located between the first and second extension bars in the second direction. Further, when a combined length of the first member and the through hole in the second direction is defined as D, and a length between an inner edge of the second extension bar and an outer edge of the first extension bar in the second direction is defined as L, an expression of $L<D$ is satisfied.

In the filter component assembly kit, the first member has an outer projection at at least one edge of the first member in the first direction. The outer projection outwardly projects from the first member. Further, when the first member is assembled with the second member and when the first extension bar is disposed in the through hole, the first member is located between the first and second extension bars in the second direction. A distance between an inner surface of the second extension bar and a middle outer surface of the first member located between the edges is longer than a distance between the inner surface of the second extension bar and a tip of the outer projection.

In the filter component assembly kit, the bobbin has first and second side surfaces that extend in the second and third directions. One of the first and second side surfaces has an engagement recess. Further, one of the third and fourth extension bars engages the engagement recess when the first member is assembled with the second member and when the first extension bar is disposed in the through hole.

In the filter component assembly kit, an assemble direction of the first and second members is perpendicular to the second direction. The engagement recess is formed by first and second engagement recesses which are formed in the first and second members, respectively, when the first member is assembled with the second member.

A filter component comprising: a bobbin including a first member connected to a second member so that a through hole is formed in a center of the bobbin, the through hole extending in a first direction; a wire wound around the bobbin; and a core that is in a quadrangular frame shape, the core being configured with first, second, third, and fourth extension bars, the first and second extension bars extending in parallel in the first direction, the third and fourth extension bars extending in parallel in a second direction, the second direction being perpendicular to the first direction. Further, the first extension bar is disposed in the through hole of the bobbin so that rotation of the core around the first extension bar is prevented. First allowance of the first extension bar in the second direction in the through hole is larger than second allowance of the first extension bar in a third direction in the through hole, the third direction being perpendicular to the first and second directions.

In the filter component, the first extension bar is fixed to a boundary of the through hole.

A method for manufacturing a filter component, the filter component including: a bobbin including a first member connected to a second member, a through hole being formed in a boundary between the first and second members, the through hole extending in a first direction; a wire wound around the bobbin; and a core that is in a quadrangular frame shape, the core being configured with first, second, third, and fourth extension bars, the first and second extension bars extending in parallel in the first direction, the third and fourth extension bars extending in parallel in a second direction, the second direction being perpendicular to the first direction. First allowance of the first extension bar in the second direction in the through hole is larger than second allowance of the first extension bar in a third direction in the through hole. The third direction being perpendicular to the first and second directions. The method comprising: assembling the core to the bobbin, which is formed by assembling the first and second members, so that the first extension bar is disposed in the through hole; winding a wire around the bobbin by passing the wire in a gap between the bobbin and the second extension bar after the core moves in a first moving direction from the first extension bar toward the second extension bar along the second direction so as to enlarge the gap between the bobbin and the second extension bar; and moving the core in a second moving direction opposite to the first moving direction.

In the method for manufacturing a filter component, the first and second members of the bobbin have first and second recesses, respectively, and the first and second recesses configure the boundary of the through hole. The assembling includes: disposing the first extension in the first recess of the first member; rotating the core around the first extension bar with respect to the first member so as to place the first member between the first and second extension bars; assembling the second member to the first member so as to form the boundary of the through hole, dispose the first extension bar in the through hole, and place the second extension bar in an outside of the bobbin.

In the method for manufacturing a filter component, after the core moves in the second moving direction, the first extension bar is fixed in the through hole (fixed to the boundary of the through hole).

The filter component assembly kit, the filter component, and the method for manufacturing filter component being thus described, it will be apparent that the same may be varied in many ways. Such variations are not to be regarded as a departure from the spirit and scope of the invention, and all such modifications as would be apparent to one of ordinary skill in the art are intended to be included within the scope of the following claims.

What is claimed is:
1. A filter component comprising:
a bobbin including a first member connected to a second member so that a through hole is formed in a center of the bobbin, the through hole extending in a first direction;
a rotation prevention member that is disposed on a first end surface of the bobbin, the first end surface being located at an edge of the bobbin in the first direction;
a core that is in a quadrangular frame shape, the core being configured with first, second, third, and fourth extension bars, the first and second extension bars extending in parallel in the first direction, the third and fourth extension bars extending in parallel in a second direction, the second direction being perpendicular to the first direction; and
a wound wire that is wound around the first direction so that the wound wire is disposed on a periphery of the bobbin,
wherein the first extension bar of the core is disposed in the through hole,
the rotation prevention member is configured to prevent the core from rotating around the bobbin with the first extension bar as a rotation axis,
wherein the rotation prevention member is an L-shaded rib configured by a first sub-rib and second sub-rib, and
the first and second sub-ribs are connected to each other to form the L-shaped rib.

2. The filter component according to claim 1,
wherein a cross section of the first extension bar is quadrangular, and a cross section of a boundary of the through hole is quadrangular.

3. The filter component according to claim 1,
wherein the first sub-rib extends along a vertical direction, and the second sub-rib extends along a horizontal direction, and
a length of the first sub-rib is different from a length of the second sub-rib.

4. The filter component according to claim 1,
wherein the bobbin has the first end surface and a second end surface that are located at opposite edges of the bobbin in the first direction,
the first end surface is configured by first and second sub-surfaces corresponding to the first and second members of the bobbin, respectively, and the second end surface is configured by third and fourth sub-surfaces corresponding to the first and second members of the bobbin, respectively,
the rotation prevention member is configured with first and second rotation prevention sub-members, and
the first rotation prevention sub-member is disposed on the first sub-surface, and the second rotation prevention sub-member is disposed on the second sub-surface.

5. The filter component according to claim 1,
wherein the first and second members of the bobbin have first and second recesses, respectively, and the first and second recesses configure the through hole when the first member is assembled with the second member,
the first member has a first recess projection projecting toward the second member and an opposite first recess inner wall, the first recess projection partially configures the first recess, and the opposite first recess inner wall is opposed to the first recess projection while sandwiching the first recess therebetween,
the second member has a second recess projection projecting toward the first member and an opposite second recess inner wall, the second recess projection partially configures the second recess, and the opposite second recess inner wall is opposed to the second recess projection while sandwiching the second recess therebetween, and
when the first member is assembled with the second member and when the first extension bar is disposed in the through hole, the first and second recess projections engage with the opposite second and first recess inner walls of the second and first recesses, respectively.

6. The filter component according to claim 1, wherein the first member has first and second outer projections at opposite edges of the first member in the first direction, and the first and second outer projections outwardly project along an assembling direction of the first member and the second member, and the second member has third and fourth outer projections at opposite edges of the second member in the first direction, and the third and fourth outer projections outwardly project along the assembling direction.

7. A bobbin comprising:

a first member;

a second member that is connected to the first member so that a through hole is formed in a center of the connected first and second members, the through hole extending in a first direction; and a rotation prevention member that is disposed on a first end surface of one of the first member or the second member, the first end surface being located at an edge of the bobbin in the first direction, wherein the first and second members have first and second recesses, respectively, and the first and second recesses configure the through hole, the rotation prevention member is configured to prevent a core from rotating around the bobbin when part of the core is disposed in the through hole and remaining parts of the core are located outside of the through hole, wherein the rotation prevention member is an L-shaped rib configured by a first sub-rib and a second sub-rib, and the first and second sub-ribs are connected to each other to form the L-shaped rib.

8. The bobbin according to claim 7, wherein a cross section of a boundary of the through hole is quadrangular.

9. The bobbin according to claim 7, wherein the first member has first and second outer projections at opposite edges of the first member in the first direction, and the first and second outer projections outwardly project along an assembling direction of the first member and the second member, and the second member has third and fourth outer projections at opposite edges of the second member in the first direction, and the third and fourth outer projections outwardly project along the assembling direction.

10. The bobbin according to claim 7, wherein the first sub-rib extends along a vertical direction, and the second sub-rib extends along a horizontal direction, and a length of the first sub-rib is different from a length of the second sub-rib.

11. The bobbin according to claim 7, wherein the bobbin has the first end surface and a second end surface that are located at opposite edges of the bobbin in the first direction, the first end surface is configured by first and second sub-surfaces corresponding to the first and second members of the bobbin, respectively, and the second end surface is configured by third and fourth sub-surfaces corresponding to the first and second members of the bobbin, respectively, the rotation prevention member is configured with first and second rotation prevention sub-members, and the first rotation prevention sub-member is disposed on the first sub-surface, and the second rotation prevention sub-member is disposed on the second sub-surface.

12. The bobbin according to claim 7, wherein the first and second members of the bobbin have first and second recesses, respectively, and the first and second recesses configure the through hole when the first member is assembled with the second member, the first member has a first recess projection projecting toward the second member and an opposite first recess inner wall, the first recess projection partially configures the first recess, and the opposite first recess inner wall is opposed to the first recess projection while sandwiching the first recess therebetween, the second member has a second recess projection projecting toward the first member and an opposite second recess inner wall, the second recess projection partially configures the second recess, and the opposite second recess inner wall is opposed to the second recess projection while sandwiching the second recess therebetween, when the first member is assembled with the second member and when the first extension bar is disposed in the through hole, the first and second recess projections engage with the opposite second and first recess inner walls of the second and first recesses, respectively.

* * * * *